(12) United States Patent
Leskowitz et al.

(10) Patent No.: US 8,712,706 B2
(45) Date of Patent: Apr. 29, 2014

(54) METHOD AND APPARATUS FOR PRODUCING HOMOGENEOUS MAGNETIC FIELDS

(75) Inventors: Garett M. Leskowitz, Calgary (CA); Gregory McFeetors, Calgary (CA); Sebastien Pernecker, Le Lieu (CH)

(73) Assignee: Nanalysis Corp., Calgary, Alberta (CA)

( * ) Notice: Subject to any disclaimer, the term of this patent is extended or adjusted under 35 U.S.C. 154(b) by 374 days.

(21) Appl. No.: 12/957,987

(22) Filed: Dec. 1, 2010

(65) Prior Publication Data

US 2011/0137589 A1   Jun. 9, 2011

Related U.S. Application Data

(60) Provisional application No. 61/266,015, filed on Dec. 2, 2009.

(51) Int. Cl.
*G01R 15/00*   (2006.01)

(52) U.S. Cl.
USPC ............................................. 702/57; 335/209

(58) Field of Classification Search
USPC .......................................... 702/115–117, 106
See application file for complete search history.

(56) References Cited

U.S. PATENT DOCUMENTS

| | | | | |
|---|---|---|---|---|
| 3,569,823 A * | 3/1971 | Golay | ............................ | 324/320 |
| 3,622,869 A | 11/1971 | Golay | | |
| 3,735,306 A | 5/1973 | Kabler et al. | | |
| 4,581,580 A | 4/1986 | Keim | | |
| 4,602,234 A * | 7/1986 | Butson | ............................ | 335/299 |
| 4,631,481 A * | 12/1986 | Young et al. | .................. | 324/320 |
| 4,680,551 A * | 7/1987 | O'Donnell et al. | ........... | 324/320 |
| 4,682,111 A | 7/1987 | Hughes | | |
| 4,740,753 A * | 4/1988 | Glover et al. | ................. | 324/320 |
| 4,761,614 A * | 8/1988 | Prammer et al. | .............. | 324/320 |
| 4,803,433 A * | 2/1989 | McBride | ...................... | 324/318 |
| 4,853,663 A | 8/1989 | Vermilyea | | |
| 5,003,276 A * | 3/1991 | Sarwinski et al. | ............ | 335/304 |
| 5,006,804 A | 4/1991 | Dorri et al. | | |
| 5,045,794 A | 9/1991 | Dorri et al. | | |
| 5,061,897 A * | 10/1991 | Danby et al. | .................. | 324/318 |
| 5,063,934 A * | 11/1991 | Rapoport et al. | ............. | 335/297 |
| 5,105,153 A * | 4/1992 | Mueller et al. | ................ | 324/322 |
| 5,237,275 A * | 8/1993 | Takechi et al. | ................ | 324/320 |
| 5,320,103 A * | 6/1994 | Rapoport et al. | ............. | 335/296 |
| 5,343,183 A * | 8/1994 | Shimada et al. | .............. | 335/301 |
| 5,373,239 A | 12/1994 | Marek et al. | | |
| 5,391,990 A * | 2/1995 | Schmitt et al. | ................ | 324/320 |
| 5,400,786 A | 3/1995 | Allis | | |

(Continued)

OTHER PUBLICATIONS

Nanalysis Corp. et al, PCT international Search Report issued for International Application No. PCT/CA2010/001920, dated Mar. 10, 2011, 5 pages.

(Continued)

*Primary Examiner* — Sujoy Kundu
*Assistant Examiner* — Alvaro Fortich
(74) *Attorney, Agent, or Firm* — Michael G. Johnston; Moore and Van Allen PLLC

(57) ABSTRACT

A method for shimming a magnetic field is disclosed. The method uses a single shim current to contribute to suppression of more than one geometrical component of an inhomogeneity in the magnetic field without changing the geometry of the shim path. Apparatuses to implement the method are also disclosed. In embodiments the apparatuses comprise substantially commonly oriented shim paths.

22 Claims, 14 Drawing Sheets

(56) References Cited

U.S. PATENT DOCUMENTS

| | | | | |
|---|---|---|---|---|
| 5,431,165 A * | 7/1995 | Sellers | | 600/422 |
| 5,463,363 A * | 10/1995 | Ogawa | | 335/299 |
| 5,545,995 A * | 8/1996 | Schneider et al. | | 324/318 |
| 5,592,091 A * | 1/1997 | Manabe | | 324/320 |
| 5,602,480 A * | 2/1997 | Onodera et al. | | 324/320 |
| 5,614,827 A * | 3/1997 | Heid | | 324/320 |
| 5,617,029 A * | 4/1997 | Schneider | | 324/320 |
| 5,754,047 A * | 5/1998 | Onodera et al. | | 324/320 |
| 5,773,976 A | 6/1998 | Sakakura et al. | | 318/460 |
| 6,014,069 A * | 1/2000 | Havens et al. | | 335/216 |
| 6,023,167 A * | 2/2000 | DeMeester et al. | | 324/318 |
| 6,064,208 A * | 5/2000 | Steckner | | 324/320 |
| RE36,782 E | 7/2000 | Brown et al. | | 335/216 |
| 6,100,695 A * | 8/2000 | DeMeester et al. | | 324/318 |
| 6,104,192 A * | 8/2000 | Ehnholm et al. | | 324/319 |
| 6,181,137 B1 * | 1/2001 | Havens et al. | | 324/320 |
| 6,208,142 B1 * | 3/2001 | Wagshul | | 324/319 |
| 6,218,839 B1 * | 4/2001 | Shaikh et al. | | 324/320 |
| 6,255,929 B1 * | 7/2001 | Xu et al. | | 335/299 |
| 6,281,775 B1 * | 8/2001 | Rapoport | | 335/306 |
| 6,294,972 B1 * | 9/2001 | Jesmanowicz et al. | | 335/301 |
| 6,369,464 B1 * | 4/2002 | Schauwecker et al. | | 307/91 |
| 6,377,148 B1 * | 4/2002 | Forbes et al. | | 335/301 |
| 6,384,601 B1 * | 5/2002 | Wiesler et al. | | 324/309 |
| 6,411,187 B1 * | 6/2002 | Rotem et al. | | 335/296 |
| 6,489,770 B1 * | 12/2002 | Hirata | | 324/320 |
| 6,515,476 B1 * | 2/2003 | Oshio et al. | | 324/309 |
| 6,545,476 B1 * | 4/2003 | Heid | | 324/320 |
| 6,630,829 B1 | 10/2003 | Liu | | |
| 6,696,835 B2 | 2/2004 | Goto | | |
| 6,781,377 B2 | 8/2004 | Marek | | |
| 6,844,801 B2 * | 1/2005 | Huang et al. | | 335/296 |
| 6,922,055 B1 * | 7/2005 | Damadian et al. | | 324/318 |
| 7,023,309 B2 * | 4/2006 | Laskaris et al. | | 335/306 |
| 7,148,689 B2 * | 12/2006 | Huang et al. | | 324/319 |
| RE39,460 E * | 1/2007 | Crozier et al. | | 335/299 |
| 7,215,123 B2 | 5/2007 | Axel | | |
| 7,368,915 B2 | 5/2008 | Schuster et al. | | |
| 7,414,401 B1 * | 8/2008 | Lvovsky | | 324/318 |
| 7,427,908 B1 * | 9/2008 | Painter et al. | | 335/301 |
| 7,439,836 B2 * | 10/2008 | Lvovsky et al. | | 335/299 |
| 7,541,904 B2 * | 6/2009 | Ni et al. | | 335/216 |
| 7,570,141 B2 | 8/2009 | Hollis et al. | | |
| 8,115,580 B2 * | 2/2012 | Ni et al. | | 335/216 |
| 2001/0012915 A1 * | 8/2001 | Avrin et al. | | 600/424 |
| 2001/0050176 A1 * | 12/2001 | Gebhardt et al. | | 174/68.1 |
| 2002/0047763 A1 * | 4/2002 | Schauwecker et al. | | 335/216 |
| 2002/0097122 A1 * | 7/2002 | Rapoport | | 335/304 |
| 2002/0105402 A1 * | 8/2002 | Crozier et al. | | 335/216 |
| 2003/0095021 A1 * | 5/2003 | Schauwecker et al. | | 335/216 |
| 2003/0234649 A1 * | 12/2003 | Amann et al. | | 324/318 |
| 2004/0044280 A1 * | 3/2004 | Paley et al. | | 600/410 |
| 2005/0033154 A1 * | 2/2005 | deCharms | | 600/410 |
| 2005/0248348 A1 * | 11/2005 | Axel | | 324/320 |
| 2006/0197526 A1 * | 9/2006 | Weiger et al. | | 324/307 |
| 2006/0244451 A1 * | 11/2006 | Ni et al. | | 324/320 |
| 2007/0035300 A1 * | 2/2007 | Schuster et al. | | 324/318 |
| 2007/0222451 A1 * | 9/2007 | Feltham et al. | | 324/320 |
| 2007/0222545 A1 * | 9/2007 | Feltham et al. | | 335/301 |
| 2007/0257758 A1 * | 11/2007 | Chen et al. | | 335/287 |
| 2007/0280524 A1 * | 12/2007 | Bekku et al. | | 382/131 |
| 2008/0106263 A1 * | 5/2008 | Fey et al. | | 324/321 |
| 2008/0116894 A1 * | 5/2008 | Weiger et al. | | 324/320 |
| 2008/0169813 A1 * | 7/2008 | Yamashita et al. | | 324/321 |
| 2008/0224702 A1 | 9/2008 | Candidus et al. | | |
| 2009/0015258 A1 * | 1/2009 | Nozaki | | 324/315 |
| 2009/0096453 A1 * | 4/2009 | Barnes et al. | | 324/319 |
| 2009/0128272 A1 | 5/2009 | Hills | | |
| 2009/0134868 A1 * | 5/2009 | Noonan et al. | | 324/307 |
| 2009/0179720 A1 * | 7/2009 | Ni et al. | | 335/302 |
| 2009/0211080 A1 * | 8/2009 | Gowland et al. | | 29/602.1 |
| 2010/0033186 A1 * | 2/2010 | Overweg et al. | | 324/318 |
| 2010/0127702 A1 * | 5/2010 | Greiser et al. | | 324/309 |
| 2010/0207630 A1 * | 8/2010 | Barnes et al. | | 324/314 |
| 2011/0001474 A1 * | 1/2011 | Miller et al. | | 324/306 |
| 2011/0012593 A1 * | 1/2011 | Shvartsman et al. | | 324/307 |
| 2011/0037467 A1 * | 2/2011 | Tsuda | | 324/309 |
| 2011/0089943 A1 * | 4/2011 | Abe et al. | | 324/301 |
| 2011/0175694 A1 * | 7/2011 | Fallone et al. | | 335/306 |
| 2011/0316535 A1 | 12/2011 | Price et al. | | |

OTHER PUBLICATIONS

Blümich, B., et al., Mobile NMR for geophysical analysis and materials testing, Petroleum Science, 2009, pp. 1-7, vol. 6.

Chmurny, G.N., et al., The Ancient and Honourable Art of Shimming, Concepts in Magnetic Resonance, 1990, pp. 131-149, vol. 2.

Danieli, E., et al., Mobile sensor for high resolution NMR spectroscopy and imaging, Journal of Magnetic Resonance, 2009, pp. 80-87, vol. 198.

McDowell, A., et al., Ultracompact NMR: 1H Spectroscopy in a Subkilogram Magnet, Applied Magnetic Resonance, 2008, pp. 185-195, vol. 35.

Michal, C.A., Magnetic field homogeneity: A new approach to orthogonalizing and optimizing shim gradients, Journal of Magnetic Resonance, 2007, pp. 110-117, vol. 185.

Moresi, G., et al., Miniature Permanent Magnet for Table-top NMR, Concepts in Magnetic Resonance Part B, 2003, pp. 35-43, vol. 19B, No. 1.

Raich, H., et al., Design and Construction of a Dipolar Halbach Array with a Homogeneous Field from Identical Bar Magnets: NMR Mandhalas, Concepts in Magnetic Resonance Part B, 2004, pp. 16-25, vol. 23B, No. 1.

Rose, M.E., Magnetic Field Corrections in the Cyclotron, Physical Review, 1938, pp. 715-719, vol. 53.

Webb et al., Rapid Fully Automated, Arbitrary Volume, In Vivo Shimming, SMRM Abstracts, 1990, p. 541.

Webb, P. et al., Rapid, Fully Automatic, Arbitrary-Volume in Vivo Shimming, Magnetic Resonance in Medicine, 1991, pp. 113-122, vol. 20.

* cited by examiner

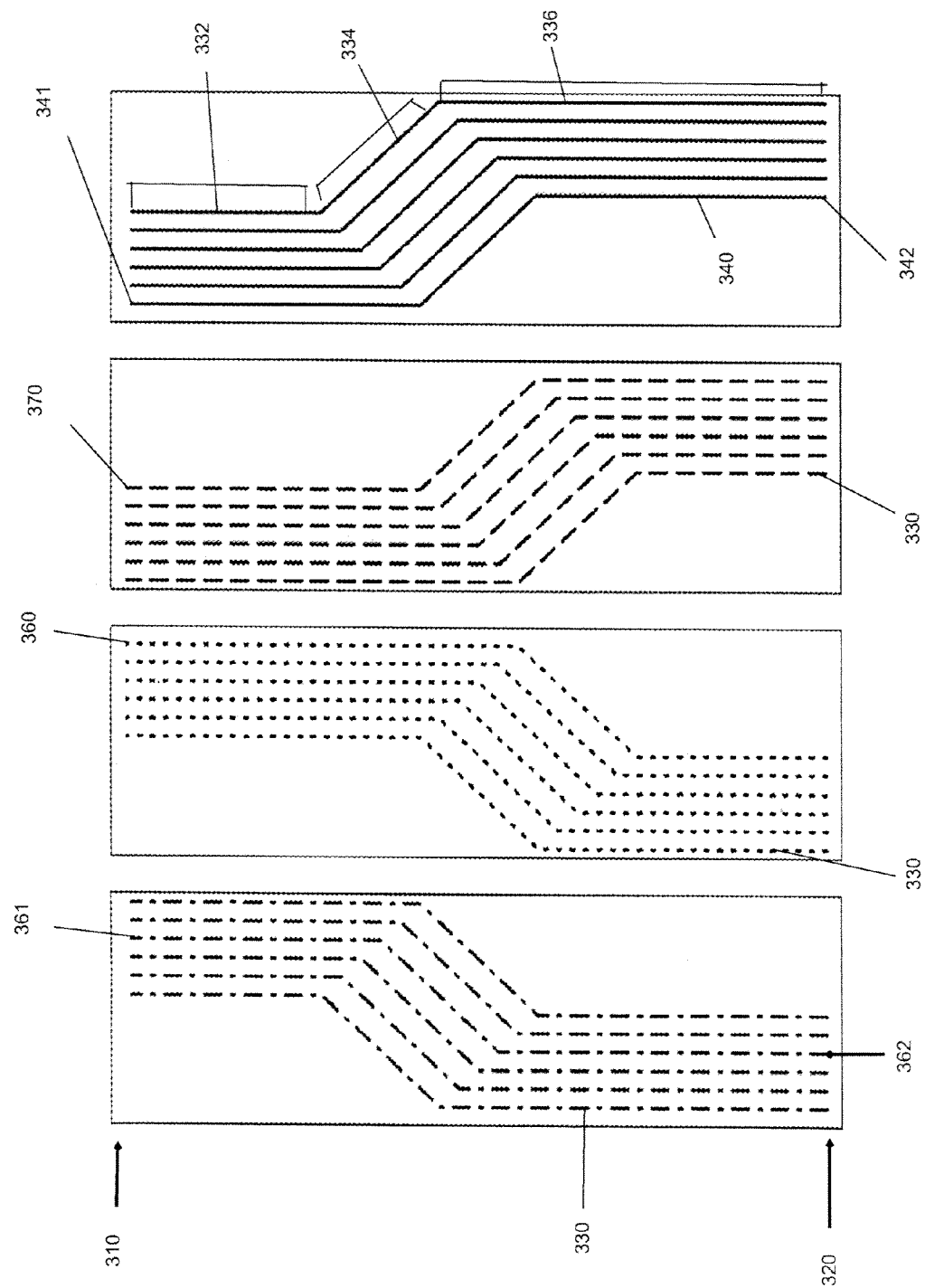

METHOD AND APPARATUS FOR PRODUCING HOMOGENEOUS MAGNETIC FIELDS

FIELD

The present disclosure relates to suppressing inhomogeneity in magnetic fields.

BACKGROUND

Relevant background publications include the following:

McDowell, A. and Fukushima, E., "Ultracompact NMR: $^1$H Spectroscopy in a Subkilogram Magnet," Applied Magnetic Resonance 35 (1), 185-195, 2008. This reference demonstrates NMR spectroscopy in a compact permanent magnet with nanoliter-volume samples.

Blümich, Bernhard, et al., "Mobile NMR for Geophysical Analysis and Materials Testing," Petroleum Science 6 (1), 1-7, 2009. This reference shows a compact NMR spectrometer that employs a Halbach magnet design.

Chmurny, Gwendolyn N. and Hoult, David I., "The Ancient and Honourable Art of Shimming," Concepts in Magnetic Resonance Part A 2 (3), 131-149, 2005. This reference details the use of spherical harmonic function expansions in shimming.

Raich, H. and Blümler, P., "Design and Construction of a Dipolar Halbach Array with a Homogeneous Field from Identical Bar Magnets: NMR Mandhalas," Concepts in Magnetic Resonance B: Magnetic Resonance Engineering 23B (1), 16-25, 2004. This reference details the use of Halbach-style magnets made from cubic magnets in nuclear magnetic resonance spectrometers.

Moresi, Giorgio and Magin, Richard, "Miniature Permanent Magnet for Table-top NMR," Concepts in Magnetic Resonance Part B: Magnetic Resonance Engineering 19B (1), 35-43, 2003. This reference discloses efforts to render the field inside Halbach arrays more homogeneous for NMR applications using flat pole pieces. It also mentions a ridged design configuration.

Danieli, Ernesto, "Mobile Sensor for High Resolution NMR Spectroscopy and Imaging," Journal of Magnetic Resonance 198, 80-87, 2009. This reference discloses efforts to render the field more homogeneous using magnets placed within the primary Halbach array.

Keim, Thomas A., "Intentionally Non-orthogonal Correction Coils for High-homogeneity Magnets," U.S. Pat. No. 4,581,580, 1986. Discloses the use of a set of shim coils capable of producing multiple spherical harmonics through variation of the specified set of applied currents. A given coil within the set can contribute to more than a single spherical harmonic function.

Golay, M. J. E., "Homogenizing Coils for NMR Apparatus," U.S. Pat. No. 3,622,869, 1971. Discloses the use of homogenizing coils for optimization of magnetic fields that consist of electrical conductors affixed to electrically insulating plates and placed parallel and adjacent to magnetic pole pieces.

Kabler, Donald J., Gang, Robert E., and Reeser, Jr., William O., "Magnetic Field Shim Coil Structure Utilizing Laminated Printed Circuit Sheets," U.S. Pat. No. 3,735,306, 1973. Discloses field homogenizing coils constructed with printed circuit sheets placed parallel and adjacent to pole pieces in a separate module.

U.S. Pat. No. 4,682,111, 1987 to Hughes discloses the use of shaped pole pieces for improving the homogeneity of the static magnetic field.

Rose N. E., "Magnetic Field Correction in the Cyclotron", Phys. Rev. 53, 715-719, 1938. Describes ridged pole pieces for use in homogenizing magnetic fields in cyclotrons.

O'Donnell, Matthew, et al., "Method for Homogenizing a Static Magnetic Field Over an Arbitrary Volume," U.S. Pat. No. 4,680,551, (issued on July 14) 1987. Discloses selection of shimming currents based on magnetic field mapping and a weighted least-squares calculation.

In a nuclear magnetic resonance (NMR) experiment, a sample is placed under the influence of a biasing static magnetic field, which partially aligns the sample's nuclear-spin magnetic moments. The moments precess in the static field at a frequency, called the Larmor frequency, which is proportional to the field strength. The magnetic moments of the sample can be manipulated by applying a transverse radio frequency (RF) magnetic field at the Larmor frequency. By observing the reaction of the sample to the RF field, insight into the chemical composition of the sample can be gained. The power of NMR as an analytical method may be largely a function of how well the characteristics of the applied magnetic fields can be controlled.

The practice of shimming magnetic fields (rendering the fields more uniform) has existed since the earliest days of NMR and originally used thin pieces of metal physically placed behind source magnets to adjust the positions of those magnets in order to refine the magnetic field. More modern shimming techniques use electro-magnetic coils. Conventional magnetic resonance spectrometers commonly use shimming coils disposed on substantially cylindrical coil forms. The use of shim coils in compact NMR devices has proved difficult primarily due to space restrictions that may not accommodate traditional shim coil systems, which can have many layers. The space available inside a main magnet in many such devices may be too small to accommodate a typical set of shimming coils whose individual elements are each designed predominantly to address one and only one geometrical aspect or geometrical component of the residual inhomogeneity of the main magnetic field.

FIGS. 1A, 1B, and 1C compare the main biasing field and sample-tube configurations of typical high-field spectrometer designs with a design for compact magnet systems that is based on the cylindrical Halbach array. The arrows labelled B indicate the main magnetic field direction. No shimming measures are shown in the figures. FIG. 1A schematically shows the superconducting field coils of the high-field magnet, an inserted cylindrical sample tube, and the field, B, produced by the coils. The magnetic field within the sample volume is aligned along the common symmetry axis of the coils and the tube.

FIGS. 1B and 1C show the same sample tube inserted into a cylindrical Halbach magnet array, which produces a field, B, perpendicular to the symmetry axis of the tube. This particular Halbach array is composed of eight magnets in a circular arrangement placed around the tube, with the magnetization vectors of the magnets (shown as arrows) perpendicular to the tube's symmetry axis. The field inside the Halbach array is quite uniform for some applications, but can be too inhomogeneous for some high-resolution NMR experiments.

In order to substantially reduce the inhomogeneity of a magnetic field, it may be helpful to have independent control over different geometrical aspects of the field inhomogeneity. In many magnetic resonance applications, the main magnetic field is strongly polarized along a specified direction, which we take to be the z-axis in a Cartesian reference frame whose origin is at some fixed point. The Larmor frequency of magnetic spins located at a point in space is determined by the magnitude of the field at that point, which in reasonably homogeneous fields is very well approximated by the z-component of the field, $B_z$. One can expand $B_z$ as a scaled sum of functions, $$B_z(x,y,z) = B_0 + \Sigma_k c_k f_k(x,y,z),$$

where k is a variable (or a number of variables) used to index the various functions, $f_k$, in the set, and where x, y, and z are Cartesian or other spatial coordinates defining positions within a volume enclosing at least part of the sample. $B_0$ is the large and spatially uniform part of the field, and the coefficients, $c_k$, quantify different components of the field inhomogeneity. Such sets of functions, for example x, z, xy, $\frac{1}{2}(z^2-y^2)$ are said to be orthogonal (with respect to a specified scalar product of functions) if the scalar product between two functions that are not the same is zero. A common scalar product between two functions is the integral, $$\langle k_1 | k_2 \rangle = \int_V W(x,y,z) f^*_{k_1}(x,y,z) f_{k_2}(x,y,z) dV,$$

where V denotes a volume relevant to the functions over which the integral is calculated, where the star denotes complex conjugation, and where W denotes a weighting function defined on the volume, which quantifies how important the volume element at (x, y, z) is in its contribution to the integral.

For example, an expansion in spherical harmonic functions is used, where the functions are $$f_{n,m}(x,y,z) = N_{n,m} P_{n,m}(\cos\theta)\exp(im\phi),$$

where $\theta = \tan^{-1}(\sqrt{x^2+y^2}/z)$ and $\phi = \tan^{-1}(y/x)$, where $P_{n,m}$ denotes a Legendre polynomial or associated Legendre function, and where $N_{n,m}$ are normalization factors. In this case $W(x, y, z) = \delta(\sqrt{x^2+y^2+z^2}-1)$, where $\delta$ denotes the Dirac delta function, and the functions are said to be "orthogonal over the unit sphere." Sometimes, real-valued linear combinations of the complex-valued spherical harmonic functions are used instead.

If, in addition, the scalar product between each function $f_k$ and itself is equal to 1, then the set of functions is said to be orthonormal.

SUMMARY

Methods and apparatus for suppressing inhomogeneities in a magnetic field are disclosed. The methods comprise the use of one or more shim paths, and a shim path may be used to shim more than one geometrical component of the field without any change in the geometry or spatial location of the shim path.

In a first embodiment there is disclosed a method for shimming a magnetic field in which there is an inhomogeneity having more than one geometrical component, the magnetic field being produced by a magnet assembly, the method comprising: applying a plurality of coordinately modulated single shim currents along corresponding ones of a plurality of substantially commonly oriented shim paths, a portion of each shim path located within the magnet assembly; and suppressing the more than one geometrical component of the inhomogeneity in the magnetic field using the plurality of shim currents.

In an alternative embodiment the plurality of shim currents are disposed in a common plane.

In an alternative embodiment individual ones of the substantially commonly oriented shim paths: are substantially straight; or comprise two substantially straight portions separated by an abrupt change of direction; or comprise three substantially straight portions separated by abrupt changes of direction; or comprise a region having a zig-zag configuration.

In an alternative embodiment a sample is inserted into the magnetic field along an axis and the orientation of the shim paths is substantially parallel to the axis.

In an alternative embodiment each individual one of the plurality of shim currents flows in a respective one of the plurality of shim paths and wherein the individual ones of the currents are determined by: estimating a magnetic field produced by application of a known current to each of the plurality of shim paths; computing a scalar product of functions representative of the geometrical components of the estimated magnetic field to obtain geometrical component values; arranging the geometrical component values into a matrix; determining a pseudoinverse of the matrix to obtain pseudoinverse matrix values; and choosing the individual ones of the currents according to the pseudoinverse matrix values.

In an alternative embodiment the applying comprises coordinately adjusting the magnitudes of the shim currents.

In an alternative embodiment a single shim current induces an image current in a magnetically permeable material in the vicinity of the shim path.

In an alternative embodiment there is disclosed a detector for detecting magnetic resonance in a sample exposed to a main magnetic field, the detector comprising: a substantially flat shim panel having two ends; and a plurality of shim paths having a substantially common orientation extending between the two ends, the shim paths for applying shim currents thereon.

In an alternative embodiment the detector comprises a longitudinal space having an axis, the longitudinal space for insertion of a sample probe containing the sample along the axis and wherein the orientation is substantially parallel to the axis.

In an alternative embodiment the flat shim panel comprises two flat panels.

In an alternative embodiment the detector comprises pole pieces on which are mounted the two flat shim panels, the pole pieces extending within the longitudinal space.

In an alternative embodiment one of the shim currents induces an image current within a said pole piece.

In an alternative embodiment at least a subset of the plurality of shim paths are disposed on substantially parallel planes.

In an alternative embodiment there is provided a printed circuit board on which is comprised the flat shim panel.

In an alternative embodiment the shim paths either: comprise substantially straight regions separated by an abrupt change of direction; or are substantially parallel over at least a portion of their lengths.

In an alternative embodiment there is disclosed a shim panel having first and second substantially distanced ends and a substantially flat portion comprising a plurality of shim paths each substantially extending between the ends, wherein the shim paths: comprise substantially straight regions separated by an abrupt change of direction of the path; or are substantially parallel over at least a portion of their length; or have a substantially common orientation.

In alternative embodiments the shim paths are in a common plane.

In alternative embodiments the detector accepts insertion of a sample along an axis and the ends of said panel are substantially oriented along said axis.

In alternative embodiments the shim panel comprises a printed circuit board.

In an alternative embodiment there is disclosed a method for determining the shim currents for a magnetic resonance device the method comprising the steps of: estimating the magnetic field produced by application of a known current to a number of shim paths; finding the geometrical components of a produced magnetic field using a scalar product of functions; arranging the values obtained as geometrical components into a matrix; and choosing the applied currents according to values in a pseudoinverse of the matrix.

In embodiments a magnetic resonance device may be an NMR detector and may be an NMR spectrometer.

In embodiments the shim currents are determined by estimating the effects of unit currents applied to the paths and the estimating may comprise: simulating a unit shim field; or mapping a unit shim field.

In embodiments each individual current flows in a path and individual ones of said currents are determined by: finding the scalar product of the geometrical components of unit shimming fields for the paths; arranging the products into a matrix; and choosing currents as proportional to values in a corresponding entry in a pseudoinverse of said matrix.

In embodiments there is disclosed a shimming apparatus for shimming a magnetic field having two geometrical components, the apparatus comprising a shim path and characterised in that the apparatus is operable to suppress inhomogeneities in different geometrical components of the magnetic field by changing the magnitude of a current applied to the path while the geometry of the path remains constant.

Features and advantages of the subject matter hereof will become more apparent in light of the following detailed description of selected embodiments, as illustrated in the accompanying figures. As will be realized, the subject matter disclosed and claimed is capable of modifications in various respects, all without departing from the scope of the subject matter hereof. Accordingly, the drawings and the description are to be regarded as illustrative in nature, and not as restrictive.

BRIEF DESCRIPTION OF THE DRAWINGS

FIG. 11B shows a first layer of shim paths from the panel according to FIG. 11A.

FIG. 11C shows a second layer of shim paths from the panel according to FIG. 11A.

FIG. 11D shows a third layer of shim paths from the panel according to FIG. 11A.

FIG. 11E shows fourth layer of shim paths from the panel according to FIG. 11A.

DETAILED DESCRIPTION OF THE PREFERRED EMBODIMENTS

Figure 1A:
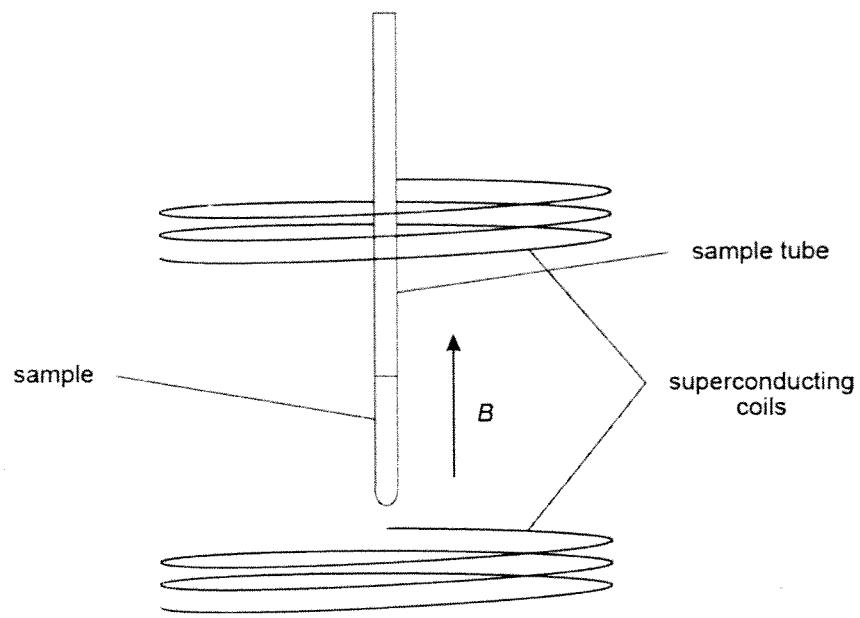
FIG. 1A is a schematic side view showing a sample tube in an arrangement of coils for producing a strong magnetic field aligned along a sample tube's symmetry axis for NMR.

In this disclosure, the recitation of a specified number of elements is understood to include the possibility of any greater number of such elements. Thus, for example, the recitation that a shim panel comprises two shim paths indicates that the shim panel comprises at least two shim paths, but may comprise 3, 4, 5 or any number of shim paths greater than two. Similarly, reference to individual ones of a group of elements indicates that any single one or more than one of such elements has the specified property or characteristic.

In this disclosure the term "shimming" refers to any method for suppressing magnetic field inhomogeneity. The magnetic field may be a primary magnetic field and may be generated or maintained within a magnetic resonance device, which may be an NMR machine, may be a spectrometer and may be a compact NMR machine.

In this disclosure the term "magnetic resonance" or "MR" means resonant reorientation of magnetic moments of a sample in a magnetic field or fields, and includes nuclear magnetic resonance (NMR), electron spin resonance (ESR), magnetic resonance imaging (MRI) and ferromagnetic resonance (FMR). As the present invention pertains to methods and apparatus for rendering general static magnetic fields more uniform, the invention may also be applied in ion cyclotron resonance (ICR). In particular applications and embodiments the apparatuses and methods disclosed are applied to NMR and in embodiments they are applied to NMR spectrometers or to NMR imagers. Materials that display magnetic resonance when exposed to a magnetic field are referred to as magnetically resonant or MR active nuclides or materials.

In this disclosure the terms "shim", "path," "shim path," "shim trace", "current path" and the like refer to current conducting paths for suppressing inhomogeneities in a primary magnetic field. A "shim current" is a current applied to a shim path. A "shim field" or "shimming field" refers to a magnetic field generated by one or more shim paths or shim currents. In embodiments such paths may be supported on a suitable surface generally referred to as a "shim board" or "shim panel," which may be a board and may be substantially non-conductive or substantially non-magnetic. In embodiments a path may be directly supported by the surface of a primary magnet or the surface of a magnetically permeable material. In particular embodiments paths may be provided in or on one, two, three, four or five or more layers or planes or in or on less than six, five, four, three or two layers or planes of a shim panel, and a shim panel may comprise or support any suitable number of shim paths. In particular embodiments shim panels may comprise or support 8 or 24 paths but in alternative embodiments 1, 2, 3, 4, 5, 6, 7, 8, 9, 10, 11, 12, 13, 14, 15, 16, 17, 18, 19, 20, 21, 22, 23, 24, 25, 26, 27, 28, 29, 30 or more paths are possible. A panel may comprise substantially opposed or mutually distanced ends, and a path may have ends proximate each of the two ends of the shim panel. In embodiments shim panels may be positioned parallel or perpendicular to a primary magnetic field or in any other desired orientation.

In embodiments of shim panels the disposition of shim paths on multiple layers or planes may allow better and more accurate control of the shimming fields. In embodiments shim panels may be printed circuit boards which may be ultra thin printed circuit boards with paths in the appropriate geometry. In alternative embodiments the construction of the shim panels may use magnetically transparent materials such as low temperature co-fired ceramics ("LTCC"). A range of alternative materials will be readily apparent to those skilled in the art. The paths may be parallel or substantially parallel over their length. A path may reverse direction and may be curved or straight in whole or in part. In embodiments pluralities of shim paths are disposed on a common plane and are substantially commonly oriented. The shim paths may be parallel or substantially parallel over a part of all of their length, and in embodiments may comprise two or more substantially straight regions separated by abrupt changes of direction. Thus in alternate embodiments, over its length a given shim path may be substantially straight, slightly or substantially curved, have one, two, three, four, five, six or more abrupt changes of direction, may form a spiral, may form a dog leg, may form a zig-zag, or may form any other configuration desired by a user. It will be understood that where paths are disposed on a common plane or surface, the plane or surface itself may be curved or displaced in one or more directions at one or more points. In embodiments a path may have a geometry that is disposed on a plane or on a substantially two dimensional surface.

In this disclosure the term "orientation" or "oriented" where used with respect to shim paths indicates the general alignment of the path, based on the positions of the ends of the portion of the path that is disposed on a shim panel. Thus even if the configuration of a number of paths comprises multiple changes of direction, so long as their ends are generally oriented or aligned along a common axis, those paths are referred to as having a common orientation. Similarly the orientation of a shim panel is defined relative to those of its ends or surfaces that comprise ends of shim paths.

In this disclosure a "shim current" refers to the current applied to a shim path and may have any suitable value, in magnitude or sign, for its desired purpose. In embodiments a shim current may be anywhere within a range delimited by values selected from the group consisting of about—plus or minus 1 mA, 2 mA, 3 mA, 4 mA, 5 mA, 6 mA, 7 mA, 8 mA, 9 mA, 10 mA, 20 mA, 30 mA, 40 mA, 50 mA, 60 mA, 70 mA, 80 mA, 90 mA, 100 mA, 110 mA, 120 mA, 130 mA, 140 mA, 150 mA, 160 mA, 170 mA, 180 mA, 190 mA, 200 mA, 250 mA, 300 mA, 350 mA, 400 mA, 450 mA, 500 mA, 550 mA, 600 mA, 700 mA, 800 mA, 900 mA, 1000 mA, 1500 mA, 2000 mA or more than about 2000 mA or −2000 mA. It will be understood that in embodiments the direction of a shim current may be reversed and that any reference to a value for a shim current comprises or contemplates both the positive and negative orientations or directions of such current, which will be readily selected from by those skilled in the art.

In particular embodiments, the shim current on a given shim path may flow in either direction along the path or in predominantly one direction, and may range from a current value of about 0 mA to about a maximum value, J. This maximum value J can be about 1 mA, 2 mA, 3 mA, 4 mA, 5 mA, 6 mA, 7 mA, 8 mA, 9 mA, 10 mA, 20 mA, 30 mA, 40 mA, 50 mA, 60 mA, 70 mA, 80 mA, 90 mA, 100 mA, 110 mA, 120 mA, 130 mA, 140 mA, 150 mA, 160 mA, 170 mA, 180 mA 190 mA, 200 mA, 250 mA, 300 mA, 350 mA, 400 mA, 450 mA, 500 mA, 550 mA, 600 mA, 700 mA, 800 mA, 900 mA, 1000 mA, 1500 mA, 2000 mA or more than about 2000 mA. Similarly, in particular embodiments and if desirable, the minimum value for a current may be selected from amongst the foregoing range of values.

In this disclosure the term "orthogonality" means that a specified scalar product of functions is zero when evaluated between the individual geometric components of the field. Those skilled in the art will recognise that orthogonal field correction may be desirable so that individual geometrical components of the inhomogeneity may be adjusted largely independently and is approximated in conventional large-scale nuclear magnetic resonance spectrometers, which may have several overlapping coils or other conductive shapes on a cylindrical coil form, with each coil or shape predominantly responsible for a particular orthogonal geometric component of the magnetic field, with each geometric component related to a spherical harmonic function.

In this disclosure the term "primary magnet" refers to one of the magnets contributing to a primary magnetic field for use in magnetic resonance applications. In embodiments there may be two or more such primary magnets and the homogeneity of the field (referred to as the "primary field") therebetween may be modulated or improved by the use of shimming paths.

In this disclosure the term "pole piece" refers to pieces of magnetically permeable material placed in the vicinity of primary magnets for use in contributing to or shaping the primary magnetic field. It will be understood that the pole pieces may have elongated faces and may be in the form of suitably shaped plates.

In this disclosure the term "primary" or "main" field or primary or main magnetic field means the primary field generated in an apparatus for magnetic resonance applications.

In this disclosure the term "sample volume" refers to a volume of space wherein a sample may be placed and exposed to a main or primary magnetic field for the purposes of detecting the magnetic resonance properties or the sample, including determining the presence, absence, or characteristics of magnetic resonance in the sample. The sample volume may be of any suitable dimensions and may be enclosed or partly enclosed, may be or be capable of being a vacuum or partial vacuum or being atmosphere controlled. In embodiments the sample volume may have disposed thereabout pole pieces, shim paths, shim panels and such other apparatus as may be necessary or desirable. In particular embodiments the sample volume may be or may be within or may comprise a hexagonal or cylindrical or other shaped cavity and may be bounded by one, or more or a plurality of magnets.

In this disclosure the term "pseudoinverse" means a Moore-Penrose pseudoinverse, or a pseudoinverse of linear operators or of matrices and is also referred to as a "generalised inverse." By way of illustration, for the matrix A, its pseudoinverse $A^+$ is a generalization of its inverse matrix, and it is equal to the inverse of A if A is an invertible square matrix. More precisely, the pseudoinverse $A^+$ of A is the matrix with the properties 1) $AA^+A=A$, 2) $A^+AA^+=A^+$, 3) $AA^+$ and $A^+A$ are Hermitian. In embodiments a pseudoinverse may be used to establish an acceptable best-fit solution to a series of equations or to find the optimal solution to a system of equations. In embodiments a pseudoinverse may be calculated by singular value decomposition on a digital computer using many standard computational packages, for example, Mathematica™, by Wolfram Research.™

In this disclosure the term "unit current" means an arbitrarily chosen standard current value. By way of example and not limitation, a unit current may be 1, 2, 3, 4, 5, 6, 7, 8, 9, 10, or more milliamps, or more or less. A "unit shim field" or a "unit field" refers to the magnetic field generated by a unit current flowing through a path.

In this disclosure a reference to "modulating" a magnetic field or an inhomogeneity that may be comprised therein, refers to imposing one or more desired constraints on the configuration of the field at any point in space. Thus modulating refers generally to the achievement of a desired change.

In this disclosure "suppressing" an inhomogeneity refers to any adjustment to the geometric components of a magnetic field to correct or smooth out or otherwise overcome undesired irregularities or distortions in the field. Suppressing may be complete or partial and may affect one or more geometric components. In particular embodiments suppressing may be actuated to cause a magnetic field to adopt a predetermined desired degree of homogeneity.

In this disclosure a reference to a "component" of a magnetic field refers to a vector component of the magnetic field, which may be in any direction. Reference to a "component" of an inhomogeneity refers to a geometrical component, which may, without limitation, include any functional components, such as the x, xy, or $\frac{1}{2}(z^2-y^2)$ functions, for example, in an expansion of the magnetic field on a set of such functions.

In this disclosure "estimating" a parameter, such as a field, a field component, component of inhomogeneity or a current, comprises making an assessment, which may be of any desired degree of accuracy, relating to any aspect of the parameter, and may include direction, magnitude, polarity, geometry, rate of change or the like. Estimating may be achieved by a variety of methods including simulating a field, calculating a field, measuring a unit field, mapping a field, or any other suitable method, a variety of which will be readily apparent to those skilled in the art.

In this disclosure the term "geometry" when used with reference to a shim path, shim current, shim panel, shim field, magnetic field or the like, refers to both the spatial arrangement of components and to the overall position of the structure under consideration. Thus an indication that a shim path may be used to modulate more than one component of a magnetic field without any change in the geometry of the shim path indicates that such result is achieved without changing the physical disposition of the shim path by bending or reshaping it, and also without moving the whole of the shim path to a different spatial location or orientation.

In this disclosure, any structures or portions of structures may be constructed from, consist of or comprise any suitable materials. For example in embodiments pole pieces or any other magnetically permeable components may be constructed from high permeability materials such as Mu-metal or permalloy, and these and other materials may be sold under trade names or trade-marks such as Carpenter Hymu80, Carpenter High Permeability 49, Ni49 or Alloy 4750. Those skilled in the art will readily select, adapt, and work with suitable materials for any given application.

Embodiments

Embodiments of the invention are explained with general reference to FIGS. 1 through 14.

First Embodiment

In a first general embodiment there are disclosed methods for suppressing inhomogeneities in a magnetic field and an apparatus for shimming a magnetic field. The apparatus and method may be comprised in or implemented in a magnetic resonance detector. The method may be broadly defined as a method for shimming a magnetic field, the method characterised in using a single shim current to suppress more than one geometrical component of an inhomogeneity in the magnetic field. The apparatus disclosed may be a detector for detecting magnetic resonance in a sample exposed to a main magnetic field, the detector characterised in using an individual shim path to suppress more than one geometrical component of a magnetic field inhomogeneity wherein the path extends from a first end of a support to a substantially opposed second end of the support. In an alternative formulation the embodiment comprises a shimming apparatus for shimming a magnetic field having two geometrical components, the apparatus comprising a shim path and characterised in that the apparatus is operable to suppress inhomogeneities in different geometrical components of the magnetic field by changing the magnitude of a current applied to the path while the geometry of said path remains constant or substantially constant. The embodiment also comprises a shim panel having first and second substantially opposed ends and comprising a plurality of shim paths each substantially extending between the ends and a magnetic resonance detector comprising contacts for receiving such a shim panel.

A further variant of the embodiment comprises a method for choosing the currents to be applied to a plurality of shim paths, the method comprising estimating the magnetic field produced by application of a known or unit current to the plurality of the shim paths, finding the geometrical components of a magnetic field and its inhomogeneity generated by the current paths using a scalar product of functions; arranging the values obtained as geometrical components into a matrix; and choosing the said applied currents according to values in a pseudoinverse of the matrix. The estimating may comprise mapping the magnetic fields, measuring the magnetic fields or simulating the magnetic fields and may comprise estimating image currents.

For simplicity, particular aspects of the embodiment and of any variants thereon will be described separately and in particular the method adopted for calculating the shim currents used to generate shim fields will be described separately from the physical architecture.

Figure 10:
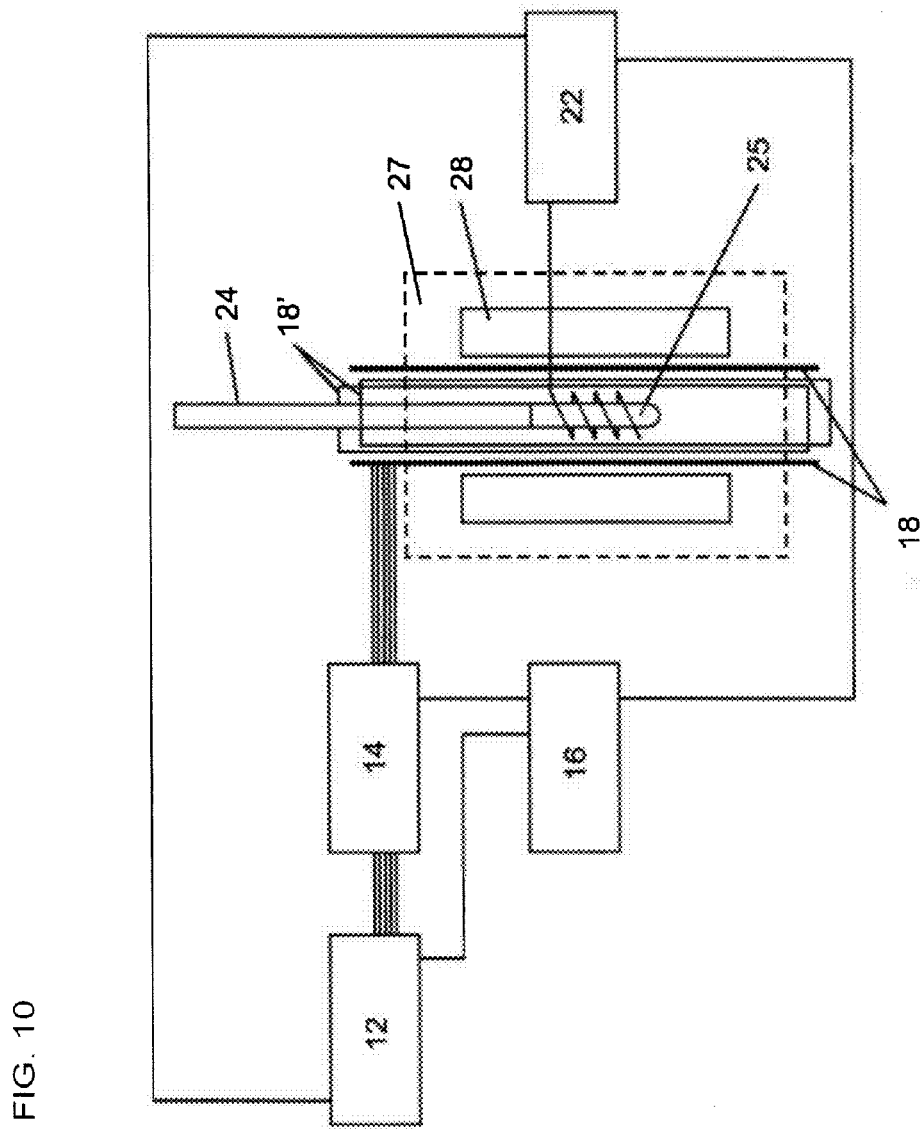
FIG. 10 shows a block diagram of a first general embodiment

A block diagram of a general form of a first embodiment generally designated 10 is described initially with general reference to FIG. 10 and may comprise a power supply or power input 16, a control system 12, current buffer circuitry 14, a generator 27 for generating a primary magnetic field, and pole pieces 28, shim panels 18, 18' having associated shim paths, spectrometer circuitry 22, and a defined sample volume 25 for accepting a sample which may be held within a sample holder or sample tube 24. It will be seen that the shim panels are provided in two opposed matching pairs, designated 18 and 18'. Thus in one embodiment of the first embodiment the four shim panels may comprise two mutually opposed shim panels which have 8 shim paths each and two mutually opposed shim panels which have 24 shim paths each.

An embodiment may be or comprise or be comprised in an integrated apparatus for detecting or measuring magnetic resonance in a sample. In particular embodiments the apparatus may be any form of magnetic resonance detector and may be or comprise an NMR spectrometer, or an NMR imager. The apparatus may be portable and may be a compact apparatus with a footprint of less than 3000, less than 2000 or less than 1000 square centimeters. The unit may be light, and in embodiments may weigh less than about 50, 40, 30, 25 or less than about 20 kilograms, so as to be man-portable. Any suitable form of construction and any suitable form of control system may be adopted, but in particular embodiments a device may be controlled from an integrated touch screen and may have an optional remote control and data processing feature. The entire system may have substantially automated system controls, optimization routines and data management.

Particular embodiments may comprise a static magnet, and may comprise pole pieces. The apparatus may comprise any number of shim boards or panels. Homogeneity optimization and control apparatus, a frequency generation and measurement apparatus and a system-controlling computer may all be provided. The shape, size, dimensions construction and arrangement of the components may all be adjusted in ways that will be readily understood by those skilled in the art.

Particular aspects of the first general embodiment are now described separately.

The shim panels bear conductive shim paths. In the first embodiment four shim panels are provided, two of which bear eight shim paths each and two of which bear 24 shim paths each. The panels may be arranged so that the two panels with 24 shim paths are mutually opposed and the two panels with eight shim paths are mutually opposed. In the first embodiment a shim panel comprises a plurality of shim paths and has two substantially opposed or mutually distanced ends. The paths may extend between connectors, one connector being proximate a first end of the panel and a second connector proximate the second end of the panel.

Figure 5:
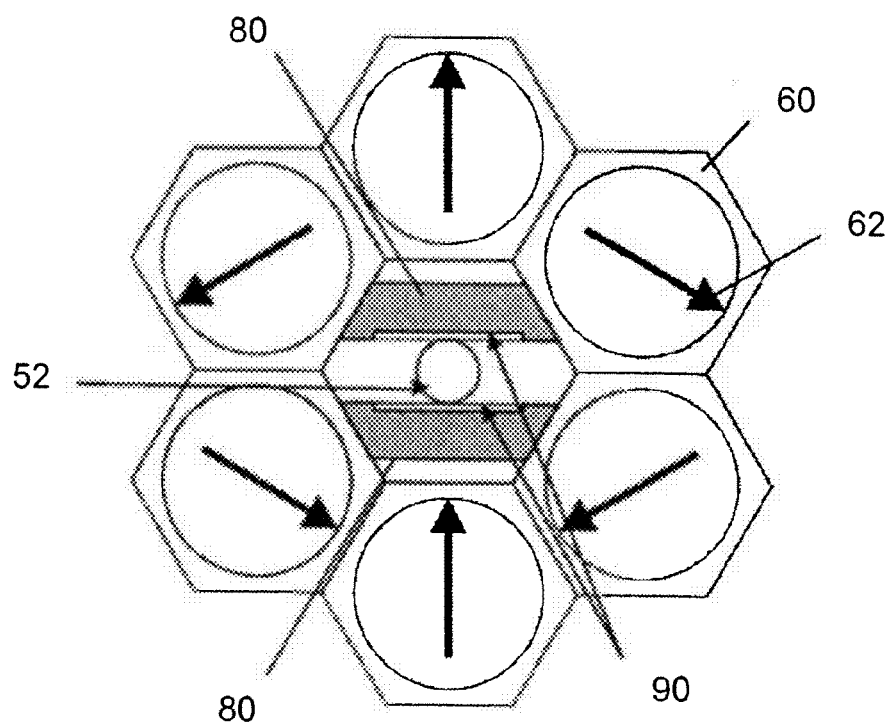
FIG. 5 shows the arrangement of two pole pieces with shim panels according to an embodiment.

Shim panels or shim paths may be placed at or near the surface of pole pieces. In one embodiment, this may be done by placing the shim paths on panels (such as circuit boards), and placing the panels on the surface of the pole pieces as shown in FIG. 5. In FIG. 5, the shim panels or shim paths 90 are placed on pole pieces 80. Non-limiting examples of the construction for these panels are copper, aluminum, gold, or silver traces on a circuit board, or similar metals embedded in a panel made using a low-temperature co-fired ceramic (LTCC) process.

In the first embodiment, each current path is not in itself correlated to a particular orthogonal geometric component of the field. Rather, each path produces a field profile that can be readily calculated. Part of this calculation takes into account the effect of the current on the pole piece, which responds with a magnetic field that may amplify the magnetic field of the applied current through an "image current" in the pole piece. In order to construct orthogonal components of the field, the currents are controlled in concert.

In the embodiment such non-orthogonal inhomogeneity correction may be used in combination with shaped pole pieces which may amplify the shimming currents through an image-current effect. In embodiments this may, through the presence of ridged edges of a pole piece, which are designed to suppress a predominant geometrical component of the overall inhomogeneity, make the necessary shim currents smaller than might otherwise be required. This may have the effect of reducing overall power consumption and heat dissipation.

Figure 7:
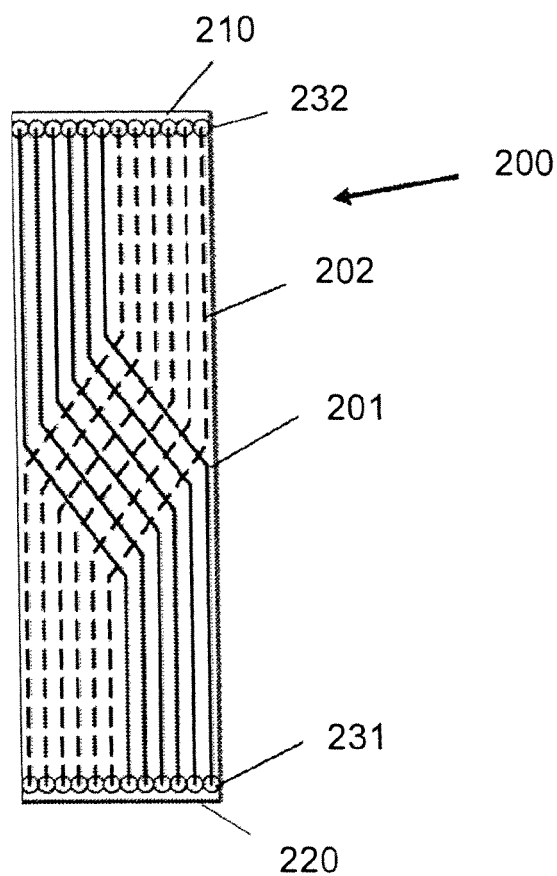
FIG. 7 is a plan view showing a second embodiment of a shim panel having a zigzag pattern of shim paths on each of two sides or two layers of the panel.
Figure 8:
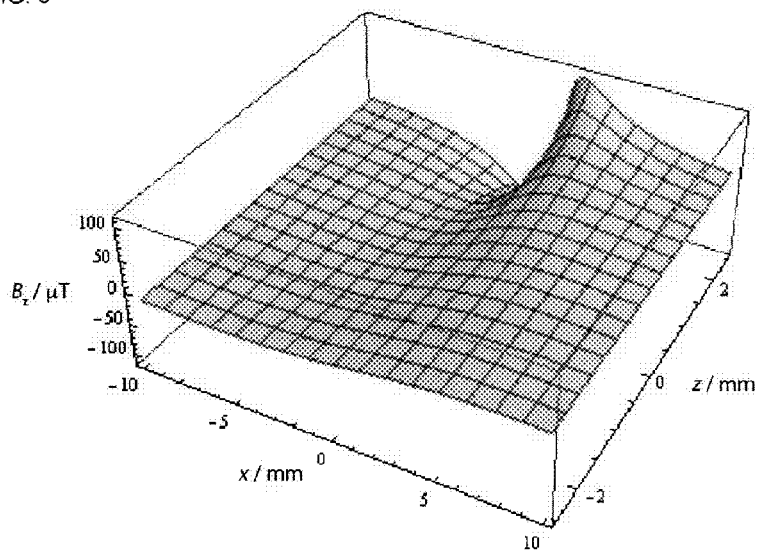
FIG. 8 is a 3-dimensional graph showing a magnetic field profile produced by applying a 200 mA current to one of the traces shown in FIG. 7 in isolation.
Figure 9:
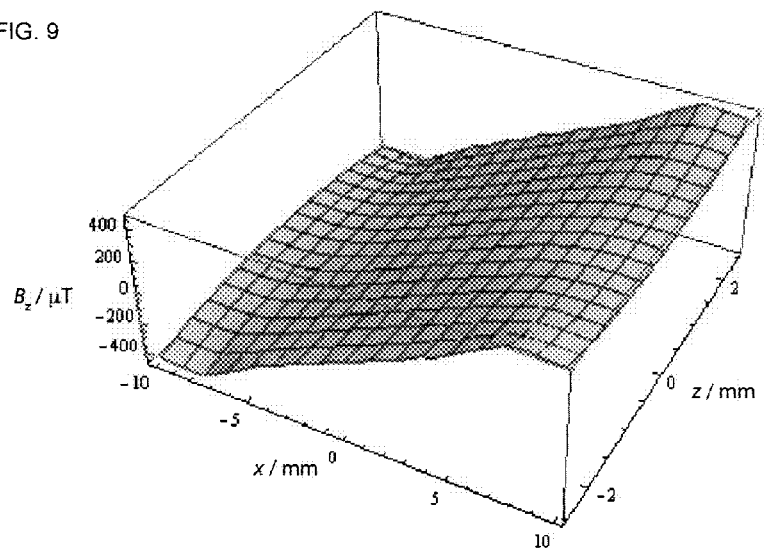
FIG. 9 is a 3-dimensional graph showing a magnetic field profile produced by applying currents to the traces of FIG. 7 in concert.

For example, running 200 milliamperes of current through one of the paths in FIG. 7 produces a field profile in the xz plane that is shown in FIG. 8. The x and z coordinates are in millimeters and the field, $B_z$, is in microtesla. FIG. 9 shows a field profile produced using a combination of currents on two shim panels of the type shown in FIG. 7. It will be seen from the figures that one panel is placed on one pole piece, and one is placed on the opposite pole piece.

In alternative embodiments an individual shim panel may comprise 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70 or more shim paths. In alternative embodiments as many as or at least as many as or more than about 1, 2, 3, 4, 5, 6, 7, 8, 9, 10, 11, 12. 13, 14, 15, 16, 17, 18, 19, 20, 21, 22, 23, 24, 25, 26, 28, 30, 32, 34, 36, 38, 40, or more individual shim panels may be provided. In embodiments groups of shim panels, such as opposed pairs of shim panels, or groups of 3, 4, 5, 6 or more shim panels, may be configured in mutual opposition or otherwise arranged to provide balanced contributions to the shimming of the main field.

In embodiments the main magnetic field generated by an apparatus has a longitudinal axis and one or more of the shim paths may be oriented so that their length substantially corresponds with the longitudinal axis of the main field.

In particular embodiments a shim panel may comprise first and second substantially mutually distanced or opposed ends and may comprise a plurality of shim paths each substantially extending between the ends. A magnetic resonance detector according to an embodiment may comprise contacts for receiving a shim panel of such design, so that a powered set of contacts for receiving a first end of the shim panel may be paired with a suitably positioned set of grounding or oppositely polarised contacts, all positioned so as to form conducting engagement with the ends of the paths and to apply selected current values thereto.

In embodiments the shim panels may be rectangular and may be substantially flat. In alternative embodiments the shim panels may have any suitable shape and may be one layered or multiple layered and may be flat or curved. Numbers of shim paths may be parallel or partly parallel over all or part of their length.

Figure 6:
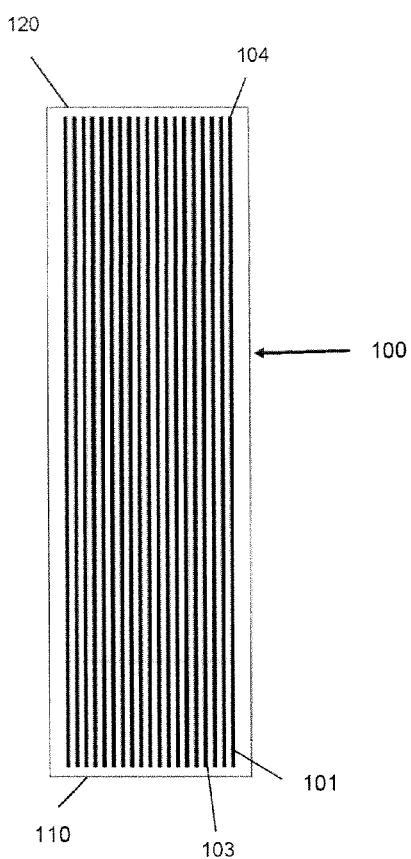
FIG. 6 is a plan view showing one embodiment of a shim panel.

FIG. 6 shows schematically a configuration generally numbered 100 with parallel shim paths 101 extending between ends or contacts 103, 104 at ends 110 and 120 of the panel. FIG. 7 shows an alternative configuration designated 200 with two layers of paths, one shown as solid lines 201 and the other as dashed lines 202. Each path has ends or poles 231 and 232 which terminate proximate ends 220 and 210 of the panel.

Figure 11A:
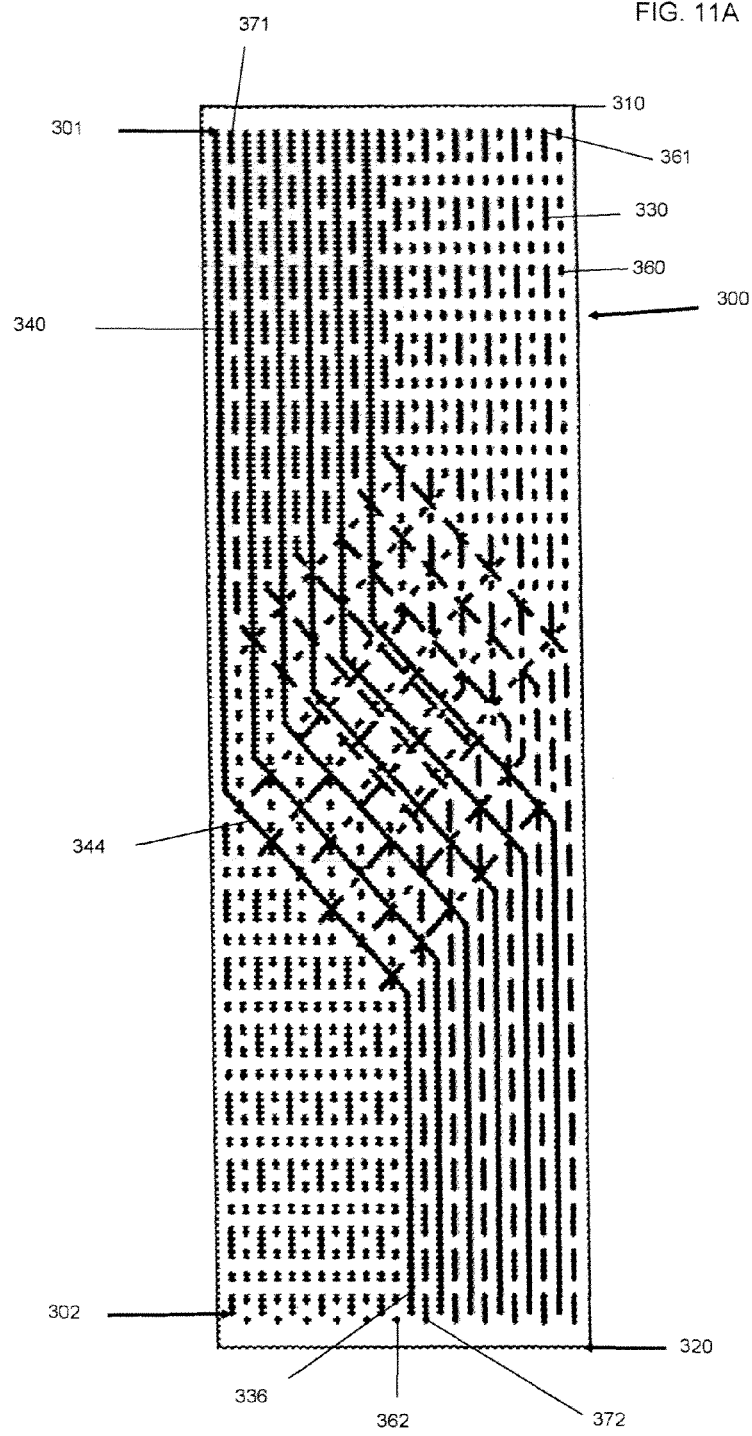
FIG. 11A shows an alternative embodiment of a shim panel.

FIG. 11 shows a further alternative configuration for a shim panel. The panel shown in FIG. 11A and generally designated 300 comprises a plurality of paths, individual paths being generally designated 330 and arranged on layers, each layer being separately illustrated in FIGS. 11B, C, D and E for clarity. Each individual path of a first set of paths 340 is shown in FIG. 11E. Each of the shim paths has opposed ends 301, 302 and is oriented so that the ends of the paths are proximate panel ends 310 and 320 respectively. It will be seen that in this design, and as shown particularly in FIGS. 11A and 11E, each path may comprise three substantially straight and parallel regions designated, 332, 334, 336, which are interspersed by changes of direction which may be abrupt or angular changes of direction.

Figure 1B:
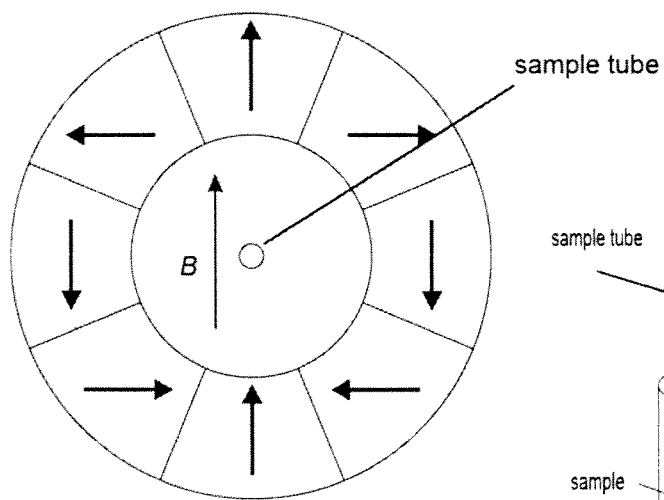
FIG. 1B is a schematic top view showing a sample tube in a cylindrical Halbach magnet array viewed along the symmetry axis of the tube.
Figure 1C:
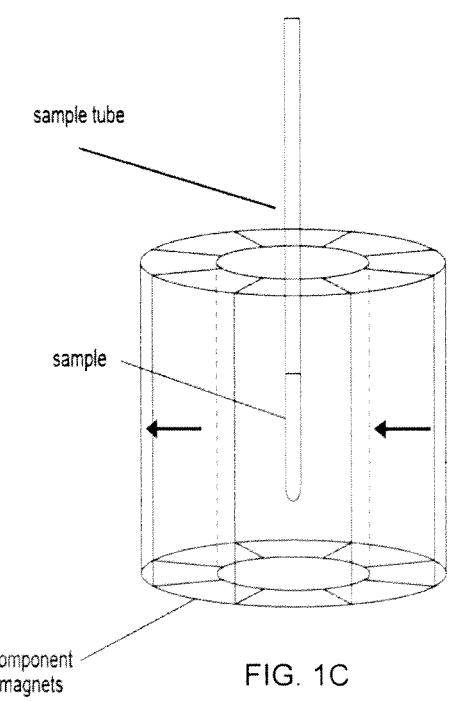
FIG. 1C is a schematic perspective view showing a sample tube in a cylindrical Halbach magnet array viewed along an axis perpendicular to the symmetry axis of the tube.

It will be seen that in the illustrated design the group of paths shown in FIGS. 1B and E are substantially mirror images, and that the paths shown in FIGS. 11C and 11D are also essentially mirror images.

Paths 330 as shown in FIG. 11B, extend from ends 361 the top right of the panel 300 to ends 362 the lower left of the panel. As shown in FIG. 11E, paths 340 extend from ends 341 the top left of the panel to ends 342 at the lower right of the panel. Likewise the panel 300 comprises additional paths 360 also extending from top right to bottom left and 370 extending from top left to bottom right. It will be understood that in this embodiment groups of paths are provided on different layers.

Figure 14:
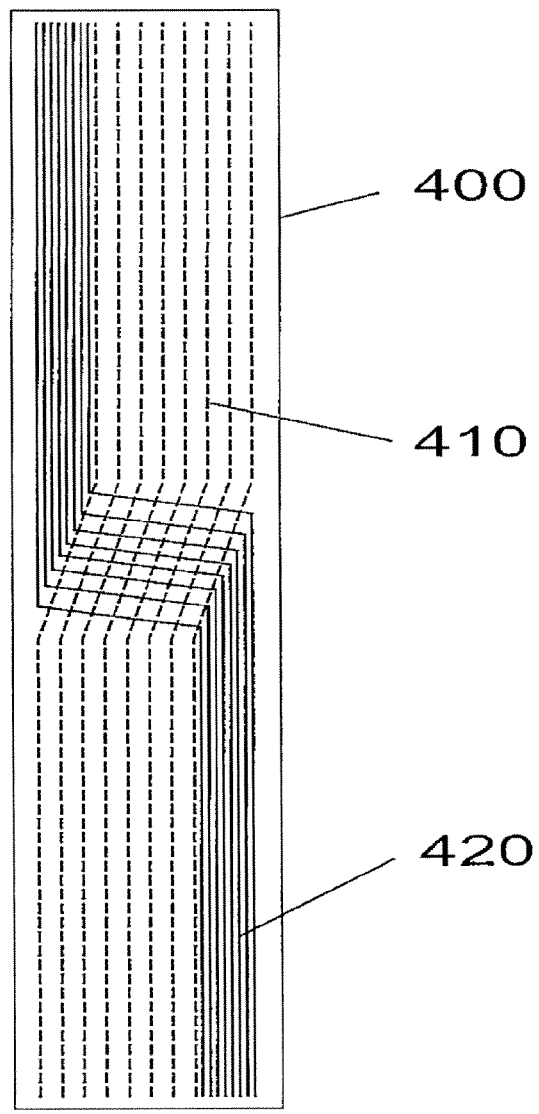
FIG. 14 shows a shim panel according to an alternative embodiment.

It will be understood that the shim paths of alternative designs may comprise one, two, three, four, five or any plurality of straight or substantially straight, or curved, portions, or of changes of direction and that the relative disposition and length of such portions of the shim paths are likewise variable and may be adjusted or selected as may be desired by a user. There is also no specific need for shim panels that are used in concert within a particular embodiment to be of the same shape, dimensions, number of layers, or design, although such similarity constraints may be useful in certain applications. In embodiments, there is no specific need for the shim panels to exhibit mirror or rotational symmetry, although this may be desirable for some applications. One possible asymmetrical embodiment is shown in FIG. 14 wherein a panel generally designated 400 bears a first set of paths 410 and a second set of paths 420, which are not mirror images of each other. It will be understood that in embodiments the different groups of paths, or subsets within such groups, may be disposed on different layers or planes, or on opposite sides of the panel 400.

It will be understood that the contacts for applying current to the paths of a shim panel may be at or near the ends of the panel. Referring now to FIG. 10 it will be seen that a sample may be inserted into the detector along an axis, and in use a shim panel and its cooperating detector may be configured so that a panel and its associated paths are generally oriented along the sample insertion axis.

In embodiments a shim panel may be or may comprise or may be comprised in a printed circuit board or a low temperature co-fired ceramic plate or a flexible polymer such as mylar or an alumina substrate. The panels may be connected to the power and control circuits through direct connection, wire or ribbon cable to a digital or analog control interface. The current supply return paths may be routed behind the pole pieces or outside the primary field producing measures to shield the sample volume from the effect of their magnetic field.

With the guidance provided herein and the common general knowledge in the art, those skilled in the art will readily select suitable numbers of shim paths and shim panels, will adopt suitable geometries for the shim paths and shim panels, and will readily configure the resulting apparatus, for a selected application.

Figure 4:
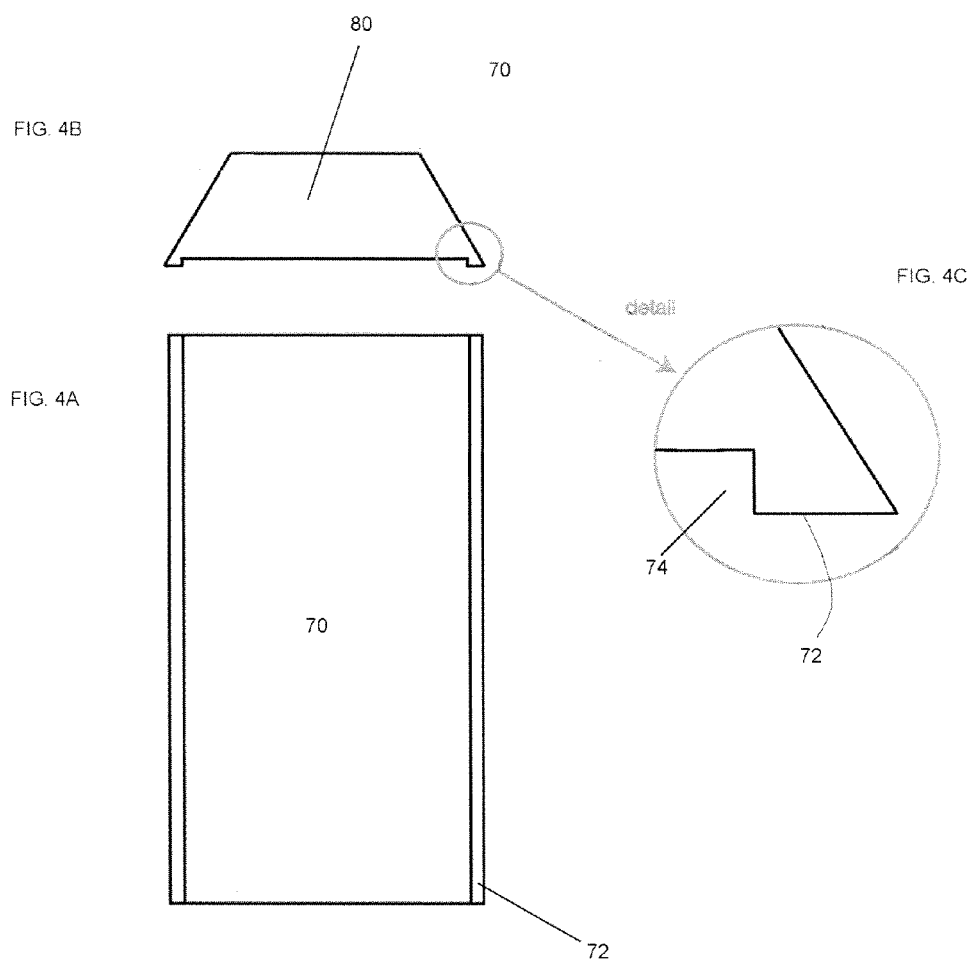
FIG. 4A shows a side view of a pole piece design for use with a shim panel according to an embodiment.
FIG. 4B is a view of a pole piece taken at right angles to FIG. 4A.
FIG. 4C shows detail of FIG. 4B.

A static magnetic field produced by permanent magnets or electromagnets may be partially homogenized by ferromagnetic pole pieces, one possible configuration for which is illustrated in FIGS. 4 and 5. These pole pieces 80 may be two parallel, substantially rectangular plates oriented normal to the direction of the static magnetic field. While the poles are useful to concentrate and homogenize the field, especially from a permanent magnet array, the edges of the poles can suffer from field non-uniformities due to the fringing effects of the field between the opposed poles. In embodiments the pole pieces are therefore shaped such that the fringing of the field at the edges is minimized. In particular, a raised edge 72 offset from the face 70 of the pole piece by a distance 74 is designed to minimize the inhomogeneities associated with the short axis of the substantially rectangular pole pieces.

Figure 2A:
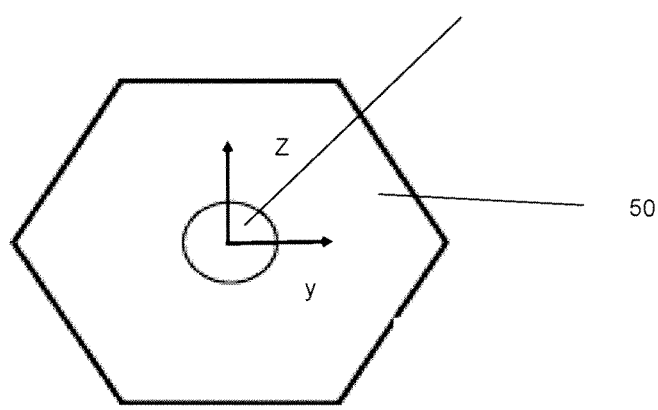
FIG. 2A is a schematic top view of a space in which an embodiment of a shim panel might be inserted or within which an embodiment of a shim panel may be positioned.
Figure 2B:
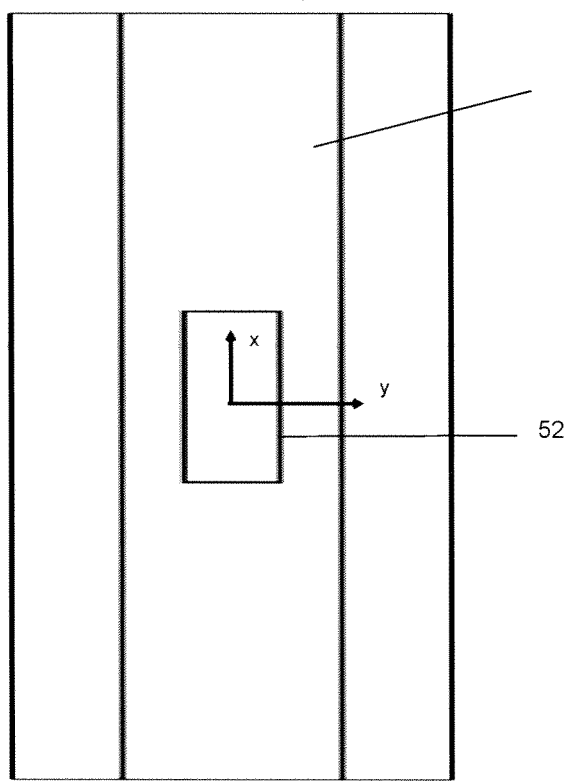
FIG. 2B is a side view of a space according to FIG. 2A.

This is illustrated in FIG. 4. The pole pieces 80 may increase field strength and homogeneity especially along the horizontal (y) axis as illustrated in FIG. 2 showing the hexagonal cavity 50 into which a sample 52 and pole pieces are inserted. As will be seen from the view presented in FIG. 4B, the pole pieces may be flared and may have ridges 72 on the flared edges to increase the field at the edges or extents of the pole pieces. As will be seen from FIG. 4A the pole piece may be generally rectangular and in particular may be longer along the axis parallel to the ridges than along the axes perpendicular to the ridges. In cross section as shown in FIG. 4B the pole piece may be broadly trapezoidal, with the base of the trapezium comprising a recess for receiving a shim panel. FIG. 4C shows detail of the flared outer edge with its raised ridges 72.

Figure 3:
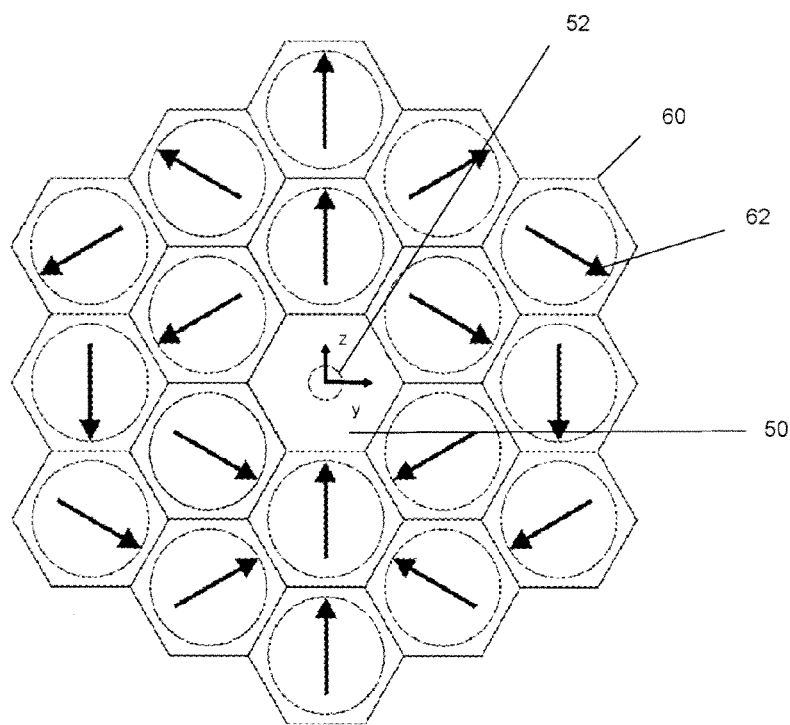
FIG. 3 shows an end view of a magnet assembly suitable for producing a magnetic field substantially along the z axis.

FIG. 3 shows the general arrangement of main magnets 60 around a channel 50 which accommodates the pole pieces and sample as shown in FIG. 5, the arrows 62 show the predominant magnetization directions of each magnet in the arrangement.

The practical range of dimensions for thickness and width of pole pieces can vary, based on field strength and homogeneity requirements, as well as sample volume restrictions. The longitudinal axis (x-direction) length can range from the length of the sample volume to longer than the magnet array itself. In embodiments pole pieces may be laminated or otherwise divided into layers interposed with thin insulating layers to reduce eddy currents within the pole pieces.

FIG. 3 shows a magnet array used to generate a primary field of the embodiment. It will be seen that a plurality of hexagonal magnets are packed together to leave a central longitudinal hexagonal cavity wherein two dimensions perpendicular to the length of the channel are designated z and y for the purposes of further reference. FIG. 2 further illustrates the geometry of the central hexagonal channel, with a longitudinal axis x, and the two mutually perpendicular axes y and z which are also perpendicular to axis x.

FIG. 5 shows the positioning of pole pieces 80 in a magnet array and also illustrates the positioning of shim panels 90 on their flared ends, which are oriented towards a sample 52. For clarity, only those magnets in the magnet array that are closest to the probe space are shown in FIG. 5. As will be seen, the pole pieces extend through the central cavity of the magnet array, and trapezoidal cross section allows them to fit lengthwise therein. The bases of the trapezia with their accompanying shim panels 90 are mutually opposed and the sample volume with the sample is between them. The pole pieces may be made of a material with a high magnetic relative permeability (eg. over 3000) so that the surfaces of the pole pieces serve substantially as equipotentials of the magnetic potential, with the magnetic field substantially perpendicular to these equipotential surfaces. Some examples of suitable materials include permalloy, mu metal, soft iron (coated so as to preclude rusting), or high-permeability cobalt or nickel alloys. In particular embodiments, the following three non-limiting criteria may be useful in specifying the shape of the pole pieces:

They should fill a substantial fraction of the probe space (the space between the magnets) while maintaining room for the designated sample volume and the shim panels. This may increase the strength of the field in addition to the desired goal of homogenizing the field.

There should be raised edges on the pole pieces running along the long edges nearest to the sample volume so that edge effects associated with the derivative $\partial^2 B_z/\partial y^2$ are reduced. The size of these ridges can be calculated using finite-element magnetostatic simulations.

In some variants of this or other embodiments, it may be desirable to have electrical cabling attached to the current paths on the shim panels and running to control circuitry run behind the pole pieces, that is, on the side opposite the sample volume, or outside the primary magnet assembly.

It will be understood that a shim path may be actuated in conventional ways by the application of a shim current therethrough, to generate a shimming field. This may be controlled through digital to analog converters with analog current amplifiers. The microcontroller used to adjust the shim currents may have resolution requirements ranging from 200-1000 uA and the overall range may be −200 to 200 mA. In alternative embodiments the shim currents may have resolution requirements between about 0-100, 0-200, 0-300, 0-400, 0-500, 0-600, 0-700, 0-800, 0-900 and 0-1000 uA. In embodiments the overall range of the shim currents may be from about −200 mA to about +200 mA and in embodiments may be between about −300 and +300 mA, between about −250 mA and +250 mA, between about −200 mA and about +200 mA, between about −150 mA and about +150 mA, between about −100 mA and about +100 mA, between about −50 mA and about +50 mA, or above about −300, −250, −200, −150, −100, −50, 0, +50, +100, +150, +200, +250, +300 or more milliamps.

In embodiments, field homogeneity may be monitored through analysis of the NMR signal shape of a known, standard compound. The field homogeneity may also be monitored through the strength of the lock signal and shim control currents may be adjusted through an automated routine that sequentially varies the current in individual paths and monitors the resultant change in lock signal strength or NMR signal shape. This procedure can be extended to pair-wise and higher order adjustment of multiple paths simultaneously through an heuristic learning algorithm analogous to a variable length running average calculation of a type used in multi-input process control.

A sample may be held by a sample probe and held within a sample tube and may be inserted into a detector. The designated volume for a sample in an embodiment is a cylinder 5 mm in diameter and about 12 mm long, and the desired magnetic field may be substantially perpendicular to the symmetry axis of this cylindrical volume. The space for insertion of the sample in this embodiment may be a prism of hexagonal cross-section 22 mm flat-to-flat and 125 mm in length, with access to the field-correction means only available through the end caps of the prism.

The probe may hold the sample in the longitudinally aligned centre of the main field generating magnet at a position such that the sample is centered upon the long axis of a transmit-receive coil.

FIG. 2 shows two views of a hexagonal prism with the designated volume shown inside. To facilitate discussion, a coordinate system is defined in the figure. The sample volume's axis of cylindrical symmetry is along the x direction, and a strong, uniform magnetic field in the z direction is desired. One way to produce this field is to assemble cylindrical magnets or prismatic magnets with hexagonal cross-section into a pattern surrounding the probe space. If the magnets are magnetized substantially uniformly and "diametrically," so that each magnet's magnetization axis is perpendicular to its predominant symmetry axis, then a suitable arrangement of magnets is shown in FIG. 3. An arrangement of magnetization vectors like this is sometimes called a "cylindrical Halbach array," which is known to make a substantially homogeneous field inside the array.

Those skilled in the art will readily understand the necessary design features and material parameters of a sample probe for use in embodiments. In embodiments and in applications involving proton-NMR, the sample probe or parts thereof may be constructed from a material that has a low proton concentration. In alternative embodiments and for alternative applications it may be desirable or necessary that the probe or part thereof has a low concentration of the relevant carbon, fluorine, phosphorus and other magnetically resonant nuclides. In embodiments the probe may be designed to accommodate flow applications wherein the sample flows into the probe via a tube and into a cell.

A sample probe may contain one or more coils tuned individually and separately to proton, fluorine, carbon, phosphorus or other magnetic-resonance active nuclide or pair-wise in combinations of two or more thereof. In particular alternative embodiments there may be additional coils and there may be 1, 2, 3, 4, 5, 6, 7, 8, 9, 10 or more coils.

In embodiments probe tuning capacitors, inductors, or other reactive elements can be connected to the RF architecture though SMA or BNC connectors, and can be electronically or manually adjustable. A probe assembly may include a temperature control sensor. The tuning elements may be connected to a monitoring and adjustment circuit that, when combined with a suitable microprocessor and optimization routine, may enable automated tuning of the circuit.

In one embodiment the sample can be confined in a cylinder of a specified length and diameter. In another embodiment, it can be a flat sample adhering to a substrate surface which might be moved into a detection region. A range of alternative configurations may be possible for particular applications. In either case, one can calculate or estimate a suitable weighting function, W(x, y, z), which can be used to estimate the relative contribution to an NMR signal that is due to spins in a volume element near the position defined by the coordinates x, y, z when such a signal is detected by a transmit/receive coil. This function can be used to define a suitable scalar product for use in defining appropriate orthogonal shimming functions.

In embodiments a coil or coils for applying pulses of oscillating magnetic fields to a sample and for monitoring the magnetic effects of these applied magnetic fields on the sample may be of any desired length, diameter and other dimensions, as may be desirable to accommodate a given sample size or shape. In particular embodiments such transmit/receive coils may have a length between 8 and 12 mm, or may be up to or less than about 5, 6, 7, 8, 9, 10, 11, 12, 13, 14, 15, 16, 17, 18, 19, or 20 mm, or up to about 1, 2, 3, 4, 5, 6, 7, 8, 9, 10, 15, 20, 25, 30, or more cm or may fall within a range whose limits are defined by any combination of ones of the foregoing values. In particular selected embodiments the diameter of the transmit receive coils may be between about 8 and 9 mm, between about 9 and 10 mm, between about 10 and 11 mm, between about 11 and 12 mm, between about 12 and 13 mm, between about 9 and 11 mm. In embodiments the transmit receive coils may have a diameter of at least about 1 mm, 2 mm, 3 mm, 4 mm, 5 mm, 6 mm or more or may have a diameter no greater than about 1 mm, 2 mm, 3 mm, 4 mm, 5 mm, 6 mm or more and in alternative embodiments transmit receive coils may have a diameter no greater than about 5.3 mm, or may have a diameter of greater than or less than about 1 mm, 2 mm, 3 mm, 4 mm, 4.1 mm, 4.2 mm, 4.3 mm, 4.4 mm, 4.5 mm, 4.6 mm, 4.7 mm, 4.8 mm, 4.9 mm, 5 mm, 5.1 mm, 5.2 mm, 5.3 mm, 5.4 mm or more. Transmit receive coils may commonly be constructed from copper wire or other suitable conductors supported by Teflon, polyimide or ceramic or other suitable materials.

While selected geometries for the transmit receive coils are disclosed, in alternative embodiments the coils may be of greater or lesser diameters or lengths or shapes to suit the specific requirements of the embodiment and all necessary changes in dimensions and configuration will readily be made and implemented by those skilled in the art.

FIGS. 3, 4 and 5 show possible magnet arrangements and designs of an embodiment. Shim panels, pole pieces and sample probe assembly can be inserted into a magnet assembly that is responsible for generating a static NMR magnetic field. In one embodiment the magnet design can be related to Halbach magnets wherein the static magnetic field is produced using an array of permanent magnets formed from stacked racks of cylindrical, permanent magnets whose cylindrical axes are or may be substantially mutually parallel but each of whose magnetization axes are substantially perpendicular to the common direction of the cylindrical axes and the cylindrical magnets are in hexagonal collars assembled into an array.

In embodiments the magnetic field strength may be between 1.3 and 1.6 Tesla (56-68 MHZ proton frequency) but those skilled in the art will readily appreciate that in alternative embodiments the magnetic field may be between about 0 and 0.5 Tesla, between about 0.5 and 1 Tesla, between about 1 and 1.2 Tesla, between about 1.2 and 1.4 Tesla, between about 1.4 and 1.6 Tesla between about 1.6 and 1.8 Tesla, between about 1.8 and 2.0 Tesla between about 2.0 and 2.2 Tesla, between about 2.2 and 2.4 Tesla between about 2.4 and 2.6 Tesla, between about 2.6 and 2.8 Tesla between about 2.8 and 3.0 Tesla or high as 3T (129 MHz) or higher. In particular alternative embodiments the magnet elements may be made from neodymium-iron-boron materials or cobalt-samarium or any other suitable magnet materials and the magnet assembly supporting frames may be machined from aluminum, polyimide or Teflon or other materials.

The magnet assembly may be shielded from external magnetic interference by an enclosure constructed from high permeability material and may be temperature monitored and controlled through the use of heaters, Peltier coolers and/or feedback control apparatus. The magnet may be mounted on an anti-vibration system. The primary magnetic field may be monitored and adjusted through the use of a second spectrometer circuit that is tuned to a second isotope, such as deuterium, different from the isotope to be examined for magnetic resonance properties. The system may monitor the frequency of the deuterium resonance and adjust either the transmitter/receiver circuit or the temperature or one or more currents in field-producing conductors in any combination accordingly to account for real-time variations in the primary magnetic field.

Embodiments of an apparatus may comprise a user interface, apparatus and method for generating, switching, transmitting and receiving radio frequency signals, pulse program controller, apparatus to digitize and store the signals, data system, temperature management, system status monitoring and control, input and output display. In embodiments the system may require 120 volt power or 240 volt power and may be configured to be operable using regular domestic and commercial plug sockets and electrical power supplies.

An aspect of the embodiments is a method for shimming a magnetic field or suppressing inhomogeneities in the magnetic field.

In embodiments the method and apparatus using the method may avoid the use of individual shim traces or shim coils each of which corresponds to an individual geometric component of the magnetic field inhomogeneity. A plurality of shim paths may have a substantially common orientation but may be operable to suppress a plurality of geometric components of an inhomogeneity. In particular embodiments the shim paths may avoid reversals of direction, may be essentially linear, and may have a first end that is positioned proximate a first end of a shim panel and a second end that is positioned proximate a second end of a shim panel. In embodiments the shim fields generated by one or more shim paths, or generated collectively by all shim paths, may be modulated by adjusting the magnitude of the current that flows through the shim path or paths. Further, in embodiments the methods and apparatuses disclosed can be used to generate a plurality of shim field configurations, able to modulate a plurality of geometric components of the primary magnetic field and any inhomogeneities therein, without the need to modify the orientation or shape or geometric configuration of the shim paths.

In other embodiments the geometry of the shim paths is not constrained by the need to provide individual shim paths corresponding to each of the geometric components to be modulated.

Broadly, the shim currents to be applied to individual shim paths in order to effectively suppress particular geometric components of the inhomogeneity in the primary field are determined by estimating or mapping the shim fields generated by unit currents in ones of the shim paths. The resulting fields are then presented as a matrix, which may be a 25×64 matrix (where 64 shim paths are provided to collectively modulate 25 spatial shim dimensions or geometrical components) input to a Moore-Penrose pseudoinverse analysis. The pseudoinverse so calculated is then used to dictate the currents that should be applied to the shim paths to generate the desired geometrical components of inhomogeneity, which can further be used as corrections to the magnetic field to suppress the inhomogeneities therein.

In embodiments the apparatuses disclosed may generate image currents in permeable materials, and the methods of calculating the appropriate shim currents consequently incorporate an allowance for the effects of such image currents.

In embodiments it may be useful to select a set of shim functions that are orthogonal with respect to a scalar product that is suited to a desired range of sample geometries. If the shim functions are orthogonal, then in alternative embodiments this may make suppression of the total inhomogeneity easier or faster. This section explains the generation of shim functions for potential shim paths where the potential shim paths are c in number, given a sample volume V and a detector coil with estimated field per unit current $B_1(x, y, z)$.

(a) Begin with s real-valued "basis" functions of spatial coordinates, for example Cartesian coordinates x, y, z, with s≤c. These functions $p_j(x, y, z)$ should be solutions to the Laplace equation, $\nabla^2 p_j=0$, so that they are suitable as magnetostatic fields. They should also include as parts the low-order polynomials in the coordinates, for example 1, x, y, z, $x^2$, xy, etc. so they are suitable as terms in a mathematical expansion of a field function. With cylindrical samples, a convenient set of basis functions are real-valued linear combinations of spherical harmonic functions $Y_{l,m}$ up to order l=n, with $n^2 \leq c$.

(b) Define a weighting function, W(x, y, z) defined within the sample volume and an associated scalar product for functions $f$ and $g$, for example $\langle f|g\rangle = \int_V W(x, y, z)f(x, y, z)g(x, y, z)dV$. The weighting function should be large in regions where spins in the sample are expected to contribute greatly to a signal measured from the detector coil, and small where the contribution will be small. A class of functions suitable for a roughly cylindrical detector coil is $W(x, y, z) = aB_1(x, y, z)\sin bB_1(x, y, z)$, where a and b are constants that can be used to optimize the total signal and to normalize the weighting function.

(c) Use a Gram-Schmidt orthogonalization procedure to generate s functions $f_j(x, y, z)$, which are linear combinations of the s basis functions, that are orthonormal with respect to the scalar product defined in step 2. These are called the shim functions.

In embodiments it may be useful to generate a set of shim profiles, which are lists of coefficients, each list having c real numbers, for a given set of shim paths, also c in number. A given shim profile corresponds to a given desired shim function. In order to produce a field function that approximates a desired shim function, currents are applied to the set of shim paths, which currents are proportional to a corresponding number in the shim profile for that shim function. This section explains how to generate a set of shim profiles for a set of corresponding shim functions, s in number, that are compatible with a set of shim paths, c in number according to the method of the invention.

1. For each current path j, estimate the magnetic field $F_j(x, y, z)$ produced at a set of points within the sample volume that is due to a unit current (1 milliampere, for example) applied to the path. The set of points should be large enough to facilitate the computation of numerical integrals of the type defined in step 2, and should be at least c in number. This can be done in a plurality of ways:
   (a) By exactly or numerically integrating the Biot-Savart law over the current path.
   (b) By using the Biot-Savart law as in (a), but also including estimated image currents produced in any high-permeability materials disposed near the current path.
   (c) By more careful magnetostatic simulation using finite-element or other electromagnetic simulation methods.
   (d) By actually applying the current and then measuring the field with a gaussmeter probe.
2. Construct a matrix $M_{i,j}$, whose entries are the scalar products $\langle f_i | F_j \rangle$. The ranges for the indices i and j are $1 \leq i \leq s$ and $1 \leq j \leq c$. Each column of this matrix is a representation of the magnetic field $F_j$ projected onto the shim functions.
3. Construct the Moore-Penrose pseudoinverse, $M^+_{j,i}$, of $M_{i,j}$. There are many standard computational packages, including Mathematica™, by Wolfram Research™, that will do this. Those skilled in the art will readily identify and use suitable packages and methods.
4. The columns of the resulting pseudoinverse matrix will then contain lists of numbers, c in length, which are scaling factors that should be used when applying currents to the shim paths in order to produce magnetic fields most closely matching the desired shim functions (in a least-squares analysis sense).

Alternative Embodiments

In a first embodiment there is disclosed an apparatus for achieving high magnetic-field homogeneity in magnet systems. In an embodiment the apparatus combines shaped ferromagnetic pole pieces with electrically conductive current paths. The paths may be imprinted on suitably dimensioned boards to form shim boards, or may be supported directly on primary magnets or pole pieces or may be supported relative to the primary magnetic field in other ways.

In one embodiment the pole pieces may be shaped to fit snugly into the hexagonal central chamber of a magnet assembly with faces parallel to each other and normal to the static field. The shaping of the opposed faces of pole pieces may increase the homogeneity and strength of the magnetic field. Ridges on the opposed pole pieces may be raised parallel to the static field and run parallel to the long axis of the magnet.

In an embodiment the pole pieces may be parallel to one another and normal to the static magnetic field. The opposed faces of the pole pieces may be raised parallel to the direction of the static field along the long axis of the pole pieces in a calculated optimal position that creates a wide, narrow channel into which a homogenizing shim panel may fit parallel to and sitting adjacent to the pole pieces. In an embodiment such a channel or matched channels may have dimensions of about 1×18×150 mm and shim boards may be sized to fit into such channels and may themselves have dimensions of about 1×18×150 mm. In embodiments the boards may have a range of different dimensions and may be of a thickness so that the exposed surface of the board is substantially flush with the surface of the pole piece adjacent to the channel.

There are disclosed apparatus and methods for suppressing inhomogeneity in a magnetic field. This may be a field in a magnetic resonance device, and may be in an NMR machine, which may be a compact NMR machine. In embodiments shim panels or shim paths may permit shimming elements of the apparatus to be reduced in size or arranged in desirable configurations. In embodiments the shimming elements may comprise conductive current paths that may be applied to a shimming board or to a pole surface and may comprise only one or two layers.

In an embodiment there is disclosed apparatus for shimming a first magnetic-field, said system comprising: two magnetic pole pieces mutually opposed on opposite sides of a volume, and an electrically conductive current path disposed relative to the volume so that modulation of the current flow in said current path is useable to controllably shim the magnetic field. In alternative embodiments the apparatus weighs less than about 21 kg.

In alternative embodiments the apparatus is an NMR machine weighing less than about 15 lbs and with a spectral resolution of better than about 0.1 ppm.

In an embodiment there is disclosed a magnetic resonance assembly comprising a plurality of elongated prisms each comprising a magnet with a magnetic axis defined relative to said prism, said plurality of magnets collectively determining a substantially homogeneous magnetic field.

Example

The following description is of an example of an embodiment and is illustrative only.

Figure 12:
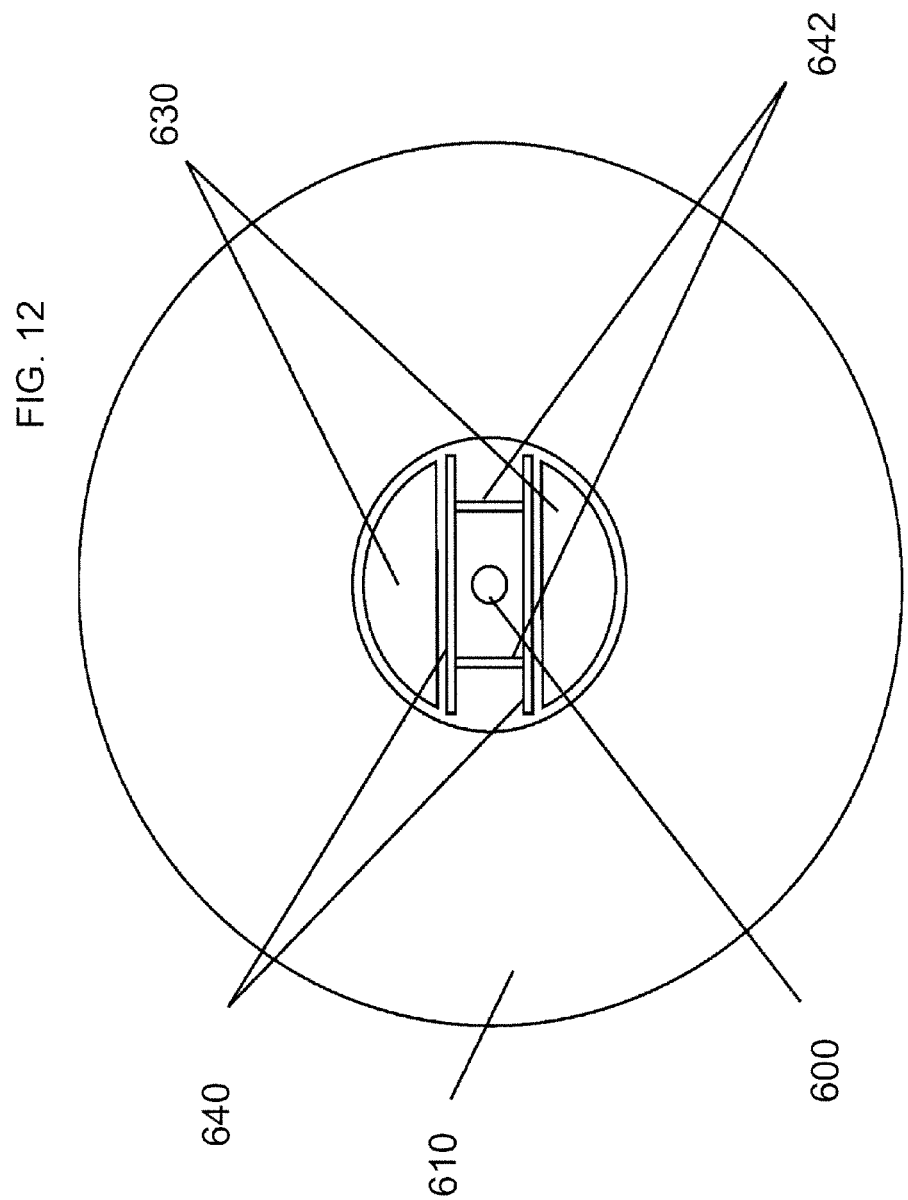
FIG. 12 shows a section perpendicular to the magnet array according to FIG. 13.
Figure 13:
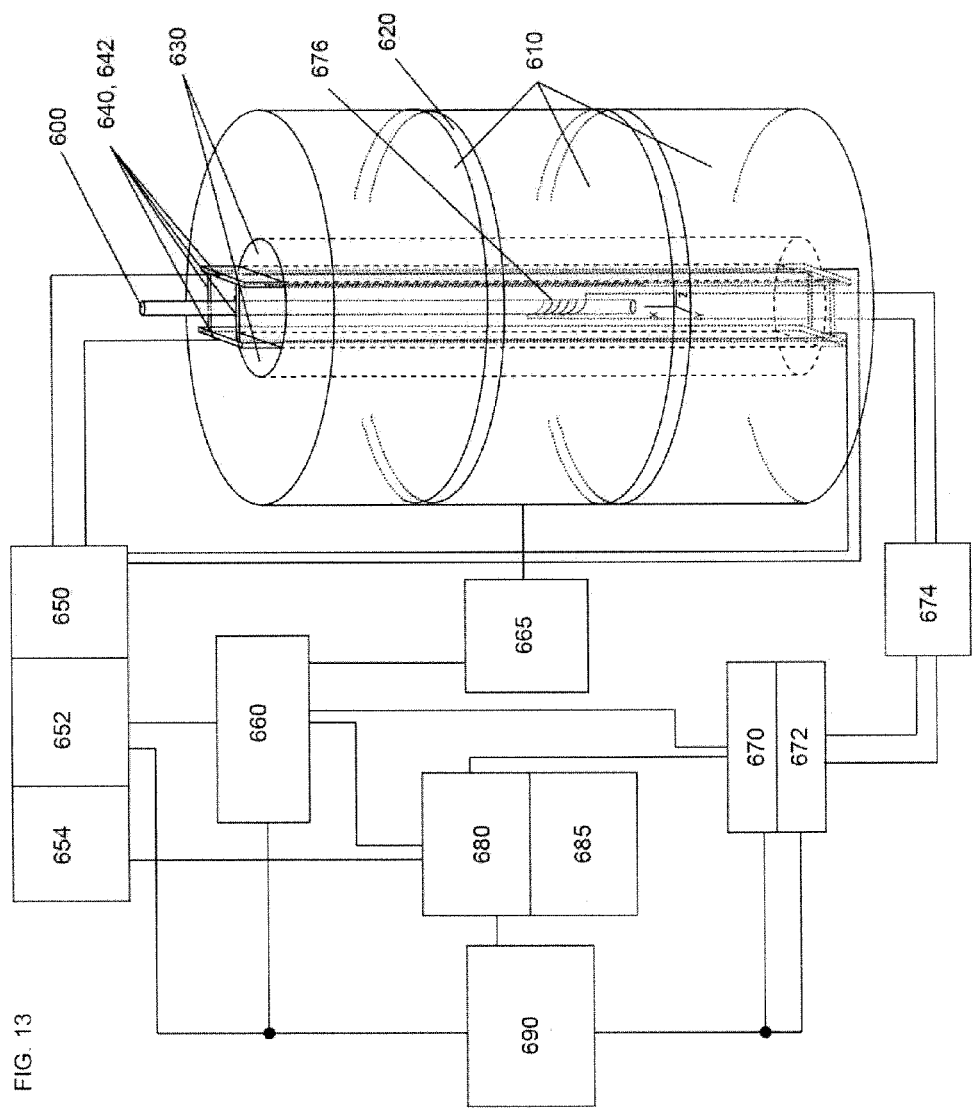
FIG. 13 shows a block diagram of an example of an embodiment.

FIG. 13 shows a block diagram of an example of an embodiment, a device for measurement of NMR of a liquid sample placed in sample tube 600. FIG. 12 shows a top view of the main magnet structure 610 in FIG. 13, along with other structures placed inside the main magnet structure. This main magnet structure is made of three racks, each containing 18 magnets, and each magnet is a cylinder or hexagonal prism of a highly magnetized, "hard" magnetic material, one suitable material being neodymium-iron-boron with a magnetization of about 1.3 T/$\mu_0$. The rack structure itself can be made of a substantially nonmagnetic material such as aluminum. Each magnet is magnetized nearly uniformly and "diametrically," meaning that its magnetization vector is perpendicular to its predominant symmetry axis. The magnetization vectors of each magnet are arranged in a "Halbach cylinder" type arrangement that is shown in FIG. 3. The racks are stacked one on top of the other as shown in FIG. 13, with the magnetization vectors of each magnet aligned in the same direction as the one above or below it. This arrangement provides a cavity (50 in FIG. 3) of hexagonal cross section, with a magnetic field on the order of 1.2 T inside the cavity. In a preferred embodiment, the hexagonal cavity and the magnets are about 22 mm side-to-side across the hexagon, the magnets themselves are about 38 mm tall, and the main magnet structure is about 130 mm tall. Nonmagnetic spacers 620, about 3 mm thick, can be placed between the magnet racks.

Pole pieces 630 can be inserted into the main magnet structure's cavity as shown schematically in FIG. 13 and FIG. 12. These pole pieces (shown schematically in FIGS. 12 and 13) are preferably not so long as the main magnet structure itself and may be about 76 mm long. A preferred cross-sectional shape 80 for the pole piece is shown in FIG. 4, and its alignment within the main magnet structure's cavity is shown in FIG. 5. The pole pieces can be made of a soft, high permeability alloy, such as permalloy or Carpenter™ high-permeability "49" alloy. The pole pieces can have a ridge running the length of the piece, can be of substantially trapezoidal cross section, and can have a variable depth of material removed from the back surface (the surface most distant from the sample tube 600). If such material is removed from the back of a pole piece, other pieces of magnetic material may be inserted or moved inside the resulting space so as to change the effective shape of the pole piece. The presence of these pole pieces, along with these shape modifications can render the field within the remainder of the cavity higher than in the absence of the pole pieces (about 1.4 T) and more uniform.

Main shim panels 640 are placed on the interior surfaces of pole pieces 630. These panels can be 2-, 3-, or 4-layer printed circuit boards about 18 mm across, about 160 mm long, and about 0.6 mm thick. The panels can be fitted with connectors on one or both ends, and the ends can extend outside the main magnet structure. FIGS. 6, 7, 11, and 13 show suitable designs for the conductors imprinted on layers of the shim panels. A set of subsidiary shim panels 642 can be inserted into the cavity of the magnet, as shown schematically in FIG. 12, and these panels can be about 8 mm across, about 160 mm long, and about 0.6 mm thick. These panels can also have patterns of straight conductors (shim paths) or zigzag-shaped conductors of the types shown in FIGS. 6, 7, 11, and 13 with the same, lesser, or greater number than the number on the main shim panels 640. In one design, there are 8 conductors on each of the subsidiary shim panels 642 and 24 conductors on each of the main shim panels 640.

The conductors on the shim panels are connected to a set of current buffers 650, which are connected to a shim current controller 652, which is controlled during operation of the device by a microcontroller 660 using information from a shim profile generator 654. These controllers and buffers can be implemented in a suitable combination of computer software and digital and analog electronics. In a specific embodiment of the example, the current buffer circuitry 650 can deliver bipolar currents in the range 0-600 mA or more to the conductors on the shim panels.

It may be desirable to monitor and stabilize the temperature of the main magnet assembly with a thermal regulator 665, and so this regulator can be provided in a, and can be controlled by microcontroller circuitry 660. The microcontroller can also be interfaced to radiofrequency transmit/receive circuitry 670, which provide radiofrequency pulses to transmit to a sample coil 676 through amplifier circuitry 674, and which receive response signals from the sample through amplifier circuitry 672.

The microcontroller circuitry and other parts of the device can be interfaced to a digital computer 680, which can itself be interfaced to a number of peripherals, such as a display unit 685 or others, such as a printer, file storage system, remote control means, or the like, through cables or wi-fi or other interface means. A power supply unit 690 is provided to supply electrical power, and in a preferred embodiment this power supply can provide about 70 W for the operation of the entire unit, but this can be more or less than 70 W in applications.

The embodiments and examples presented herein are illustrative of the general nature of the subject matter claimed and are not limiting. It will be understood by those skilled in the art how these embodiments can be readily modified and/or adapted for various applications and in various ways without departing from the spirit and scope of the subject matter disclosed. The claims hereof are to be understood to include without limitation all alternative embodiments and equivalents of the subject matter hereof. Phrases, words and terms employed herein are illustrative and are not limiting. Where permissible by law, all references cited herein are incorporated by reference in their entirety. It will be appreciated that any aspects of the different embodiments disclosed herein may be combined in a range of possible alternative embodiments, and alternative combinations of features, all of which varied combinations of features are to be understood to form a part of the subject matter hereof.

What is claimed is:

1. A method for shimming a magnetic field in which there is an inhomogeneity having more than one functional component, the magnetic field being produced by a magnet assembly having two opposed and mutually distanced assembly ends and an assembly axis, the method comprising:
    providing a plurality of commonly oriented shim paths, said shim paths disposed on a common surface having two opposed and mutually distanced ends, each of said surface ends having at least one associated electrical connector;
    applying a plurality of coordinately modulated single electronic shim currents along corresponding ones of the plurality of shim paths, each of said electronic shim currents entering said electrical connector at one said surface end, flowing from said electrical connector at said one said surface end to said electrical connector at the other said surface end, and exiting said electrical connector at the other said surface end; and;
    suppressing the more than one functional component of the inhomogeneity in the magnetic field using the plurality of electronic shim currents;
    wherein each of said surface ends is proximate a corresponding one of said assembly ends so that at least a portion of said shim currents flows from one said assembly end towards the other said assembly end.

2. The method according to claim 1, wherein each individual one of the plurality of electronic shim currents flows in a respective one of the plurality of shim paths, and wherein the individual ones of the currents are determined by:
    estimating a magnetic field produced by application of a known current to each of the plurality of shim paths;
    computing a scalar product of functions representative of the functional components of the estimated magnetic field to obtain functional component values;

arranging the functional component values into a matrix;
determining a pseudoinverse of the matrix to obtain pseudoinverse matrix values; and
choosing the individual ones of the currents according to the pseudoinverse matrix values.

3. The method according to claim 1, wherein said applying comprises coordinately adjusting the magnitudes of said electronic shim currents.

4. A detector for detecting magnetic resonance in a sample exposed to a main magnetic field, the detector comprising:
a substantially flat shim panel having two opposed and mutually distanced panel ends and a panel axis, each of said two ends having one or more associated electrical connectors, the shim panel comprising a plurality of shim paths having a substantially common orientation extending between said two panel ends, the shim paths for applying electronic shim currents thereon, each of said currents entering an electrical connector at one said panel end, flowing from said electrical connector at said one said panel end to an electrical connector at the other said panel end, and exiting said electrical connector at the other said panel end.

5. The detector according to claim 4, further comprising a longitudinal space having an axis, the longitudinal space for insertion of a sample probe containing the sample along the axis and wherein the orientation is substantially parallel to the axis.

6. The detector according to claim 5, further comprising at least two said flat shim panels, each mounted on separate ones of two pole pieces, the said pole pieces extending within the longitudinal space.

7. The detector according to claim 4, wherein at least a subset of the plurality of shim paths are disposed on substantially parallel surfaces of the shim panel.

8. The detector according to claim 4, further comprising a printed circuit board on which is comprised the flat shim panel.

9. A shim panel comprising a printed circuit board having first and second substantially distanced and mutually opposed panel ends and a substantially flat portion comprising a plurality of electrical current conducting shim paths extending between and terminating at said panel ends, wherein individual ones of the shim paths have a substantially common orientation, wherein said electrical current enters each of said shim paths at one said panel end and is conducted along each of said shim paths and exits each of said shim paths at the other of said panel ends.

10. The method according to claim 1, wherein the plurality of said shim paths are mutually connected at one of said surface ends and said mutually connected path ends are held at a grounding electric potential controlled by external electronic means.

11. The method according to claim 1, wherein said magnet assembly has an assembly axis and a sample is inserted into said magnetic field along said assembly axis.

12. A method for constructing a set of desired magnetic field configurations within a magnetic resonance apparatus comprising a plurality of shim paths, the method comprising the steps of:
(a) providing a shim panel having first and second substantially distanced panel ends and a substantially flat portion, said shim panel adapted to comprise at least a subset of said shim paths such that individual ones of said subset of said shim paths each substantially extend between said panel ends, wherein individual ones of the shim paths have a substantially common overall orientation, and wherein said subset of said shim paths are configured for applying electronic shim currents thereon, each of said currents entering a shim path at one said panel end, flowing along said shim path from said one said panel end and exiting said shim path at the other said panel end;
(b) estimating a representation of the magnetic field as a function of spatial coordinate variables produced by a known electronic shim current in a first one of said shim paths by integrating the Biot-Savart equation;
(c) computing a scalar product of (i) a desired magnetic field configuration, and (ii) a magnetic field function estimated according to step (b);
(d) repeating step (b) and step (c) for a plurality of pairs of said desired magnetic field configurations and estimated shimming field functions produced by known electronic shim currents;
(e) arranging the scalar product values of step (d) into a matrix;
(f) computing the pseudoinverse matrix values of said matrix; and
(g) using said pseudoinverse matrix values to determine the electronic currents required to construct said set of desired magnetic field configurations.

13. The method according to claim 12, wherein said method further comprises applying a plurality of coordinately modulated single said electronic shim currents along corresponding ones of a plurality of substantially commonly oriented single said shim paths, said shim paths disposed on a common surface, and suppressing more than one functional component of an inhomogeneity in the magnetic field using the plurality of said electronic shim currents.

14. The method according to claim 12 further comprising the step of
coordinately modulating electronic currents in individual ones of said plurality of shim paths according to said pseudoinverse matrix values.

15. The method according to claim 12, wherein at least a subset of said shim paths are comprised in a shim panel having first and second substantially distanced panel ends and a substantially flat portion, and individual ones of said subset of said shim paths each substantially extend between said panel ends, wherein individual ones of the shim paths have a substantially common overall orientation.

16. The method according to claim 2, wherein said applying comprises coordinately adjusting the magnitudes of said electronic shim currents.

17. The method according to claim 1, wherein said magnet assembly at least partly defines a sample volume.

18. The detector according to claim 4, wherein said magnetic field is at least partly produced by a magnet assembly having two opposed and mutually distanced assembly ends and an assembly axis, and wherein each of said two panel ends is proximate one of said assembly ends.

19. The shim panel according to claim 9, wherein said panel is adapted so that said panel is positionable in a channel within a cooperating magnet array so that said electrical current carrying shim paths extend through the channel.

20. The shim panel according to claim 19, wherein each of said panel ends comprises an electrical connector accessible from a corresponding end of the channel.

21. A method for constructing a set of desired magnetic field configurations within a magnetic resonance apparatus comprising a plurality of shim paths, the method comprising the steps of:
(a) providing a shim panel having first and second substantially distanced panel ends and a substantially flat portion, said shim panel adapted to comprise at least a subset of said shim paths such that individual ones of said subset of said shim paths each substantially extend between said panel ends, wherein individual ones of the shim paths have a substantially common overall orientation, and wherein said subset of said shim paths are configured for applying electronic shim currents thereon, each of said currents entering a shim path at one said panel end, flowing along said shim path from said one said panel end and exiting said shim path at the other said panel end;

(b) estimating a representation of the magnetic field as a function of spatial coordinate variables produced by a known electronic shim current in a first one of said shim paths by applying said current to said shim path and collecting a spatial map of magnetic field values using a magnetometer probe;

(c) computing a scalar product of (i) a desired magnetic field configuration, and (ii) a magnetic field function estimated according to step (b);

(d) repeating step (b) and step (c) for a plurality of pairs of said desired magnetic field configurations and estimated shimming field functions produced by known electronic shim currents;

(e) arranging the scalar product values of step (d) into a matrix;

(f) computing the pseudoinverse matrix values of said matrix; and (g) using said pseudoinverse matrix values to determine the electronic currents required to construct said set of desired magnetic field configurations.

22. The detector according to claim 4, wherein said magnet assembly is adapted to receive a sample inserted into said magnetic field along said assembly axis, and wherein said panel axis coincides with or is substantially parallel to said assembly axis.

* * * * *